(12) United States Patent
Kodama

(10) Patent No.: US 10,818,747 B2
(45) Date of Patent: Oct. 27, 2020

(54) SEMICONDUCTOR DEVICE AND METHOD OF MANUFACTURING THE SAME

(71) Applicant: RENESAS ELECTRONICS CORPORATION, Tokyo (JP)

(72) Inventor: Eisuke Kodama, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/407,916

(22) Filed: May 9, 2019

(65) Prior Publication Data

US 2019/0371881 A1 Dec. 5, 2019

(30) Foreign Application Priority Data

Jun. 4, 2018 (JP) .................. 2018-106644

(51) Int. Cl.

| H01L 21/02 | (2006.01) |
| H01L 49/02 | (2006.01) |
| H01L 21/324 | (2006.01) |
| H01L 21/265 | (2006.01) |
| H01L 27/06 | (2006.01) |

(52) U.S. Cl.
CPC ........ H01L 28/20 (2013.01); H01L 21/02532 (2013.01); H01L 21/02595 (2013.01); H01L 21/26506 (2013.01); H01L 21/324 (2013.01); H01L 27/0629 (2013.01)

(58) Field of Classification Search
CPC ..... H01L 28/20; H01L 27/0629; H01L 28/22; H01L 28/24; H01L 28/26; H01L 21/027; H01L 21/0334; H01L 21/0338; H01L 21/266; H01L 21/265; H01L 27/0802
See application file for complete search history.

(56) References Cited

U.S. PATENT DOCUMENTS

| 6,242,314 B1* | 6/2001 | Chen ................. H01L 28/20 257/E21.004 |
| 2004/0150507 A1* | 8/2004 | Olson ............... H01L 21/8249 338/309 |

FOREIGN PATENT DOCUMENTS

| JP | 2001-196541 A | 7/2001 |
| JP | 2003-078019 A | 3/2003 |

* cited by examiner

*Primary Examiner* — Selim U Ahmed
*Assistant Examiner* — Evan G Clinton
(74) *Attorney, Agent, or Firm* — McDermott Will & Emery LLP

(57) ABSTRACT

A semiconductor device capable of lowering a temperature coefficient and increasing a sheet resistance value (ρs value) and a manufacturing method thereof are provided. The resistive layer RL is made of polycrystalline silicon containing boron. The concentration distribution of boron in the thickness direction of the resistive layer RL includes a concentration peak PC and a low concentration portion LC having a concentration of boron lower than the concentration of boron in the concentration peak PC by two orders of magnitude or more.

15 Claims, 16 Drawing Sheets

IR   SR  SW GE DR

IR  SC2 SC2 SR  SW  GI  GE SC1 SW  DR SC2

IR  SR  SW  GE  DR

IR  SC2  SC2  SR  SW  GI  GE  SC1  SW  DR  SC2

SEMICONDUCTOR DEVICE AND METHOD OF MANUFACTURING THE SAME

CROSS-REFERENCE TO RELATED APPLICATIONS

The disclosure of Japanese Patent Application No. 2018-106644 filed on Jun. 4, 2018 including the specification, drawings and abstract is incorporated herein by reference in its entirety.

BACKGROUND

The present invention relates to a semiconductor device and a method of manufacturing the same. Japanese unexamined Patent Application publication No. 2001-196541 discloses that a thin-film polysilicon resistor having a resistance temperature coefficient of zero or small and a thin-film polysilicon resistor having a high resistance are formed in the same process by ion-implanting boron into a non-doped polycrystalline silicon film at a predetermined dose amount.

Japanese unexamined Patent Application publication No. 2003-78019 discloses that a resistive element having a temperature coefficient between negative and positive is formed by implanting an impurity into a polysilicon film under desired implantation conditions.

SUMMARY

However, in the polycrystalline silicon resistive layer described in Japanese unexamined Patent Application publication No. 2001-196541 and Japanese unexamined Patent Application publication No. 2003-78019, when the boron dose is increased, the temperature coefficient approaches 0, but at the same time, the sheet resistance value (ρs value) also decreases.

When the sheet resistance value becomes low, the resistive element area becomes large, the chip size increases, the cost increases, and high integration of the circuit is hindered.

Other objects and novel features will become apparent from the description of this specification and the accompanying drawings.

The semiconductor device of one embodiment includes a first conductive layer, a second conductive layer, and a resistive layer.

The resistive layer has a first end and a second end, and is connected to the first conductive layer at a first end and to the second conductive layer at a second end.

The resistive layer is made of polycrystalline silicon containing impurities, and the impurities include boron.

The concentration distribution of boron in the thickness direction of the resistive layer includes a concentration peak and a low concentration portion having a concentration of boron lower than the concentration of boron in the concentration peak by two orders of magnitude or more.

A method of manufacturing a semiconductor device according to an embodiment includes the following steps.

A resistive layer of polycrystalline silicon having a first end and a second end and containing impurities is formed.

A first conductive layer connected to the resistive layer at a first end and a second conductive layer connected to the resistive layer at a second end are formed.

The step of forming the resistive layer containing an impurity includes a step of forming a resistive layer, a step of introducing boron into the resistive layer, and a step of annealing the resistive layer in order to activate the boron introduced into the resistive layer.

The concentration distribution of boron in the thickness direction of the annealed resistive layer includes a concentration peak and a low concentration portion having a concentration of boron lower than the concentration of boron in the concentration peak by two orders of magnitude or more.

According to the embodiment, it is possible to realize a semiconductor device capable of lowering the temperature coefficient and increasing the sheet resistance value (ρs value) and a manufacturing method thereof.

DETAILED DESCRIPTION

First Embodiment

Embodiments will be described below with reference to the drawings.

Figure 1:
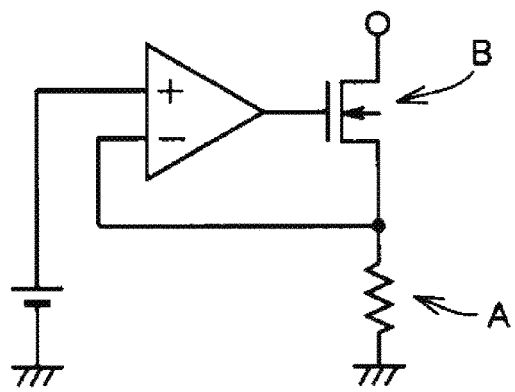
FIG. 1 is a circuit diagram of an input unit of an operational amplifier to which the semiconductor device according to the first embodiment is applied.

As shown in FIG. 1, the semiconductor device according to the present embodiment is used, for example, in a bias circuit for producing a reference current. The resistive layer used in the present embodiment is used, for example, at a position indicated by the symbol A in the bias circuit diagram. nMOS (Metal Oxide Semiconductor) Transistors are used in the biasing circuits, for example, at the location indicated by the symbol B.

Figure 2:
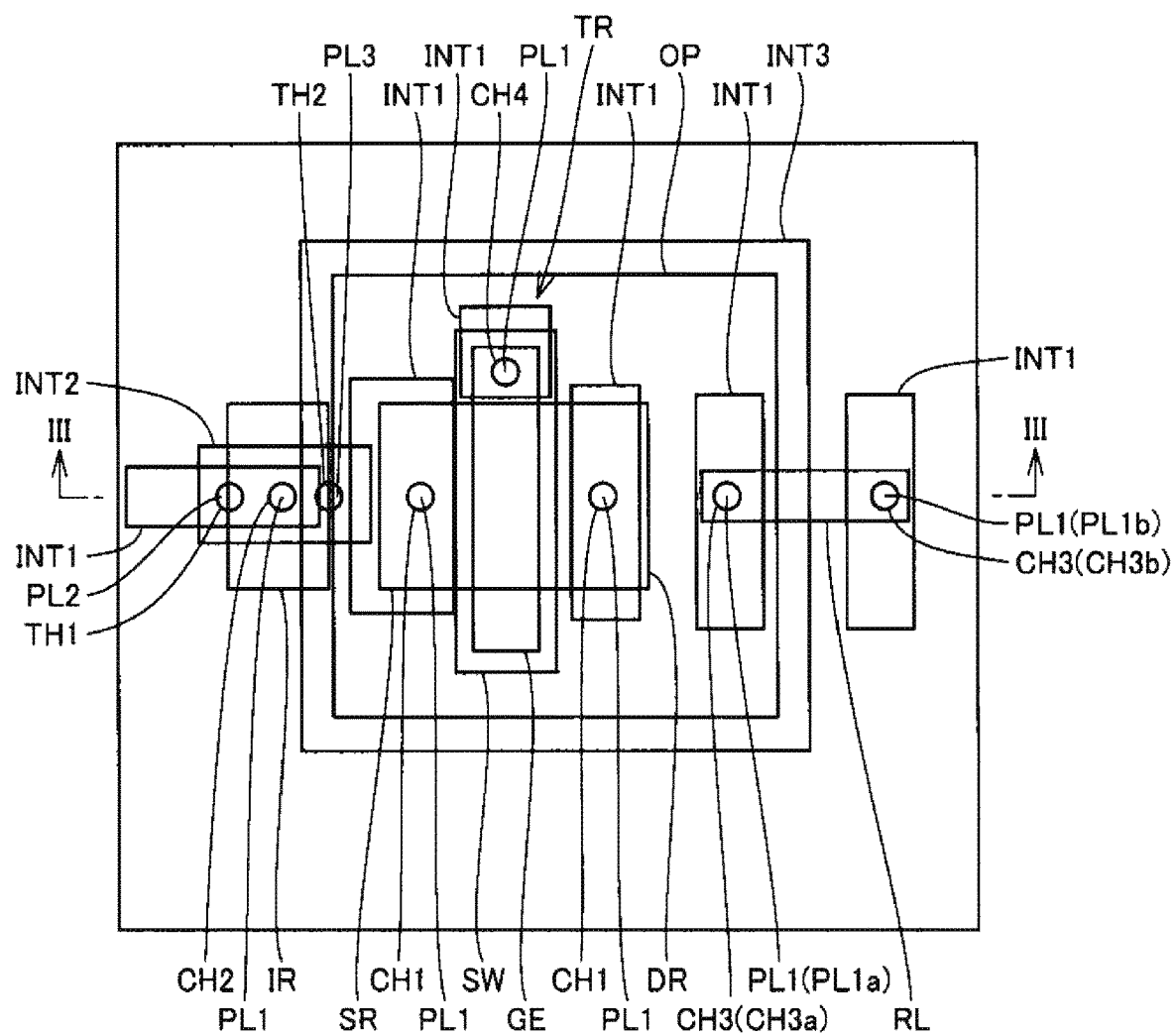
FIG. 2 is a plan view showing the configuration of the semiconductor device according to the first embodiment.
Figure 3:
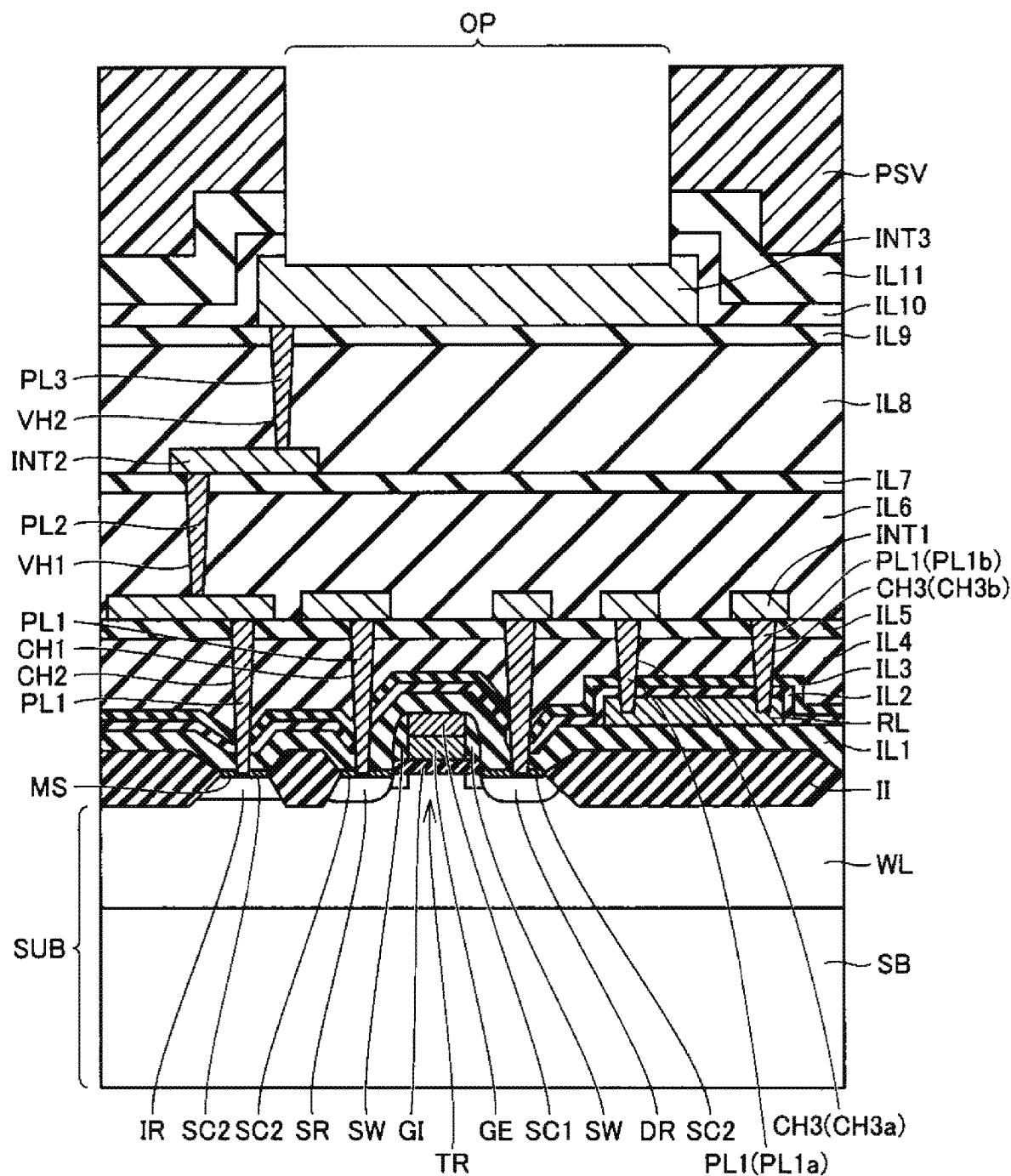
FIG. 3 is a cross-sectional view taken along the line of FIG. 2.

As shown in FIGS. 2 and 3, the semiconductor device of the present embodiment includes, for example, nMOS transistors TRs and resistive layers RLs. The nMOS transistor TR includes an n-type source region SR, an n-type drain region DR, a gate insulating film GI, and a gate electrode layer GE.

The semiconductor substrate SUB has a main surface MS. The semiconductor substrate SUB has a substrate region SB and a p-well region WL. The p-well region WL is disposed on the main surface MS of the substrate region SB.

The main surface MS of the semiconductor substrate SUB is electrically isolated by an element isolation insulating film II. The device isolation insulating film II is, for example, LOCOS (Local Oxidation of Silicon). The isolation insulating film II may be, for example, Shallow Trench Isolation.

The nMOS transistor TR is disposed on the main surface MS of the semiconductor substrate SUB electrically isolated from the semiconductor substrate SUB by the isolation insulating film II.

The n-type source region SR and the n-type drain region DR of the nMOS transistor TR are spaced apart from each other on the main surface MS of the semiconductor substrate SUB. Each of the n-type source region SR and the n-type drain region DR has, for example, an LDD (Lightly Doped Drain) configuration.

The gate electrode layer GE is disposed on the main surface MS of the semiconductor substrate SUB sandwiched between the n-type source region SR and the n-type drain region DR with the gate insulating film GI interposed therebetween. The gate insulating film GI is made of, for example, silicon oxide (SiO2). The gate electrode layer GE is made of, for example, polycrystalline silicon doped with an impurity (hereinafter referred to as "doped polysilicon").

A silicide layer SC1 is disposed on the gate electrode layer GE. The silicide layers SC1 are made of tungsten silicide, for example. Sidewall insulating films SW are arranged so as to cover the sidewalls of the gate electrode layer GE and the silicide layer SC1. The sidewall insulating film SW is made of, for example, silicon oxide.

A p-type impurity region IR is disposed on the main surface MS of the semiconductor substrate SUB. The p-type impurity regions IR are electrically isolated from the nMOS transistors TR by the isolation insulating films II. The p-type impurity region IR is for taking the potential of the semiconductor substrate SUB, for example.

Silicide layers SC2 are arranged on the surfaces of the n-type source region SR, the n-type drain region DR, and the p-type impurity region IR, respectively. The silicide layers SC2 are made of, for example, titanium silicide (TiSi).

An interlayer insulating film IL1 is disposed on the main surface MS of the semiconductor substrate SUB. The interlayer insulating film IL1 covers the nMOS transistor TR and the p-type impurity regions IR. The interlayer insulating film IL1 is made of, for example, silicon oxide.

A resistive layer RL is disposed on the interlayer insulating film IL1. The resistive layer RL is made of doped polysilicon doped with boron (B). The thickness of the resistive layer RL is, for example, 250 nm.

An interlayer insulating film IL2~IL5 is sequentially stacked on the interlayer insulating film IL1 so as to cover the resistive layer RL.

The interlayer insulating film IL2 is made of, for example, silicon oxide, and the interlayer insulating film IL3 is made of, for example, silicon nitride (SI3N4). The interlayer insulating film IL4 is made of, for example, silicon oxide, and the interlayer insulating film IL5 is made of, for example, silicon oxide formed using plasmas.

A contact hole CH1 reaching the silicide layer SC2 located on each of the n-type source region SR and the n-type drain region DR from the upper surface of the interlayer insulating film IL5 is provided. In addition, a contact hole CH2 reaching the silicide layer SC2 located above the p-type impurity regions IR from the upper surface of the interlayer insulating film IL5 is provided.

In addition, for example, two contact holes CH3 reaching the resistive layer RL from the upper surface of the interlayer insulating film IL5 are provided. The resistive layer RL has a first end on one end side in the longitudinal direction and a second end on the other end side.

The first contact hole CH3a of the two contact holes CH3 reaches the first end of the resistive layer RL. The second contact hole CH3b of the two contact holes CH3 reaches the second end of the resistive layer RL.

Contact plug conductive layers PL1 are arranged inside each of the contact holes CH1~CH3. The contact plug conductive layers PL1 include, for example, barrier metal and tungsten.

In particular, the first conductive layer PL1a disposed in the first contact hole CH3a is connected to the first end of the resistive layer RL. The contact plug conductive layer PL1b disposed in the second contact hole CH3b is connected to the second end of the resistive layer RL.

An interconnection layer INT1 is disposed on the upper surface of the interlayer insulating film IL5. Each of the interconnection layers INT1 is in contact with the contact plug conductive layer PL1. The interconnection layer INT1 has, for example, a laminated structure of barrier metal, aluminum, and barrier metal.

An interlayer insulating film IL6 and an interlayer insulating film IL7 are stacked in this order on the interlayer insulating film IL5 so as to cover the interconnection layer INT1. Each of the interlayer insulating film IL6 and the interlayer insulating film IL7 is made of, for example, silicon oxide.

A via hole VH1 reaching the interconnection layer INT1 from the upper surface of the interlayer insulating film IL7 is provided. The via plug conductive layers PL2 are disposed inside the via holes VH1. The via plug conductive layers PL2 include, for example, barrier metal and tungsten.

An interconnection layer INT2 is disposed on the upper surface of the interlayer insulating film IL7. The interconnection layer INT2 is in contact with the via plug conductive layer PL2. The interconnection layer INT2 has, for example, a laminated structure of barrier metal, aluminum, and barrier metal.

An interlayer insulating film IL8 and an interlayer insulating film IL9 are stacked in this order on the interlayer insulating film IL7 so as to cover the interconnection layer INT2. Each of the interlayer insulating film IL8 and the interlayer insulating film IL9 is made of, for example, silicon oxide.

A via hole VH2 reaching the interconnection layer INT2 from the upper surface of the interlayer insulating film IL9 is provided. The via plug conductive layers PL3 are disposed inside the via holes VH2. The via plug conductive layers PL3 include, for example, barrier metal and tungsten.

An interconnection layer INT3 is disposed on the upper surface of the interlayer insulating film IL9. The interconnection layer INT3 is in contact with the via plug conductive layer PL3. The interconnection layer INT3 has, for example, a laminated structure of barrier metal, aluminum, and barrier metal.

A cover insulating film IL10, a cover insulating film IL11, and a passivating film PSV are stacked in this order on the interlayer insulating film IL9 so as to cover the interconnection layer INT3. The cover insulating film IL10 is made of, for example, silicon oxide, and the cover insulating film IL11 is made of, for example, silicon nitride. The passivation film PSV is made of polyimide, for example.

Openings OPs are provided in the cover insulating film IL10, the cover insulating film IL11, and the passivating film PSV. The opening OP reaches the interconnection layer INT3 from the upper surface of the passivation film PSV. As a result, the interconnection layers INT3 are exposed from the openings OPs.

Figure 4:
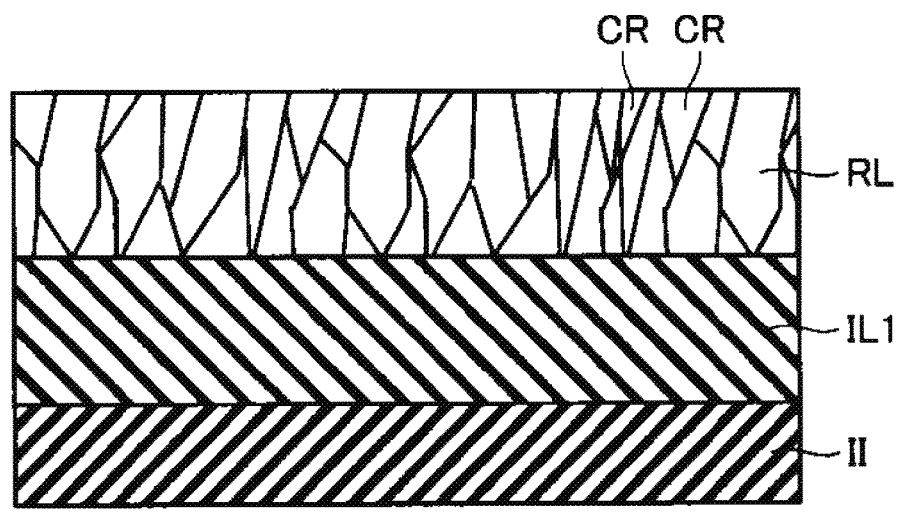
FIG. 4 is a cross-sectional view showing a crystal state of a resistive layer applied to the semiconductor device in the embodiment.

As shown in FIG. 4, the resistive layer RL is made of doped polysilicon doped with boron. Therefore, a plurality of crystal grains CR of silicon is included in the resistance layer RL.

Figure 5:
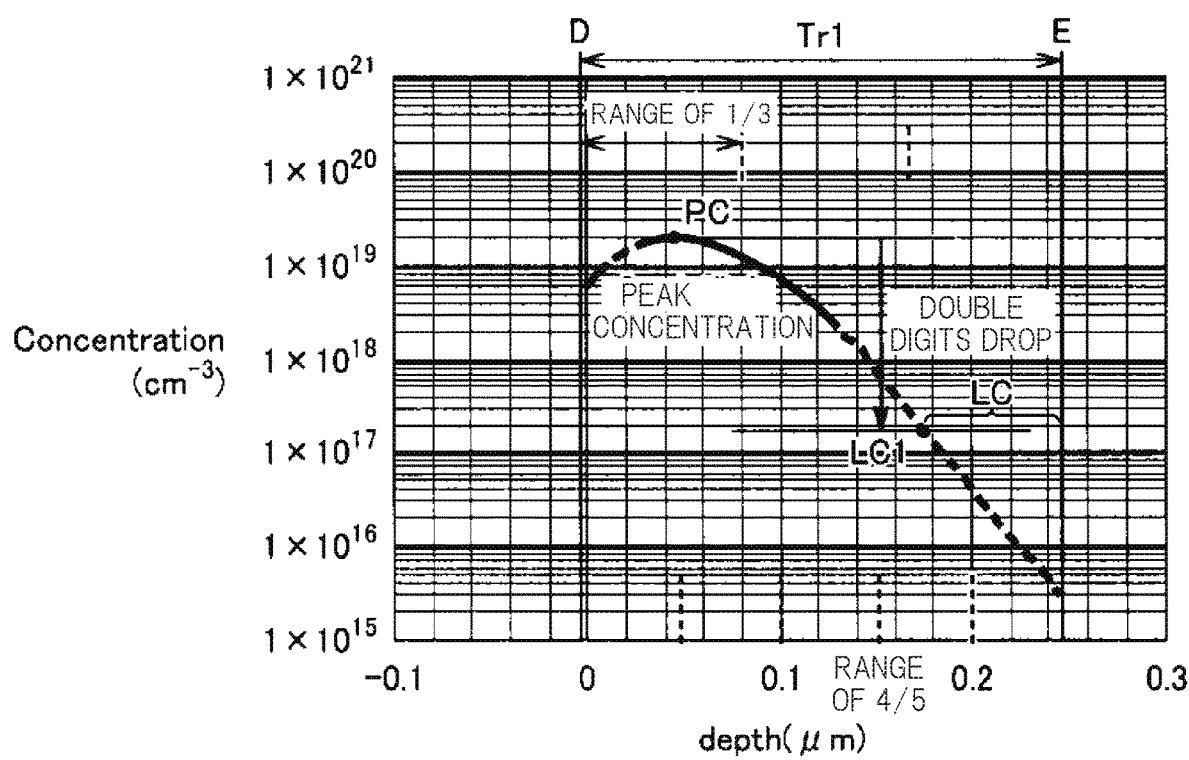
FIG. 5 is a diagram showing the concentration distribution of boron in the thickness direction in the resistive layer applied to the semiconductor device in Embodiment 1.

FIG. 5 shows the concentration distribution of boron in the thickness direction in the resistive layer RL. In FIG. 5, the symbol D indicates the position of the upper surface of the resistive layer RL. The symbol E indicates the position of the lower surface of the resistive layer RL, that is, the surface of the resistive layer RL in contact with the interlayer insulating film IL1 in FIG. 3. The lower surface and the upper surface of the resistive layer RL face each other in the thickness direction of the resistive layer RL.

As shown in FIG. 5, the concentration distribution of boron in the thickness direction in the resistive layer RL includes a concentration peak PC and a low concentration portion LC having a concentration of boron lower than the concentration of boron in the concentration peak PC by two orders of magnitude or more. The concentration of boron in the concentration peaks PC ranges, for example, from $1 \times 10^{19}$ to $1 \times 10^{21}$ cm$^{-3}$.

The concentration peak PC is located within, for example, ⅓ of the thickness Tr1 of the resistive layer RL from the upper surface D to the lower surface E of the resistive layer RL. The partial LC1 having a boron concentration lower by two orders of magnitude than the concentration peaks PC is located within, for example, ⅘ of the thickness Tr1 of the resistive layer RL from the upper surface D to the lower surface E of the resistive layer RL.

Next, a method of manufacturing a semiconductor device according to the present embodiment will be described with reference to FIGS. 6(A), (B), and 12(A), and (B).

Figure 6A:
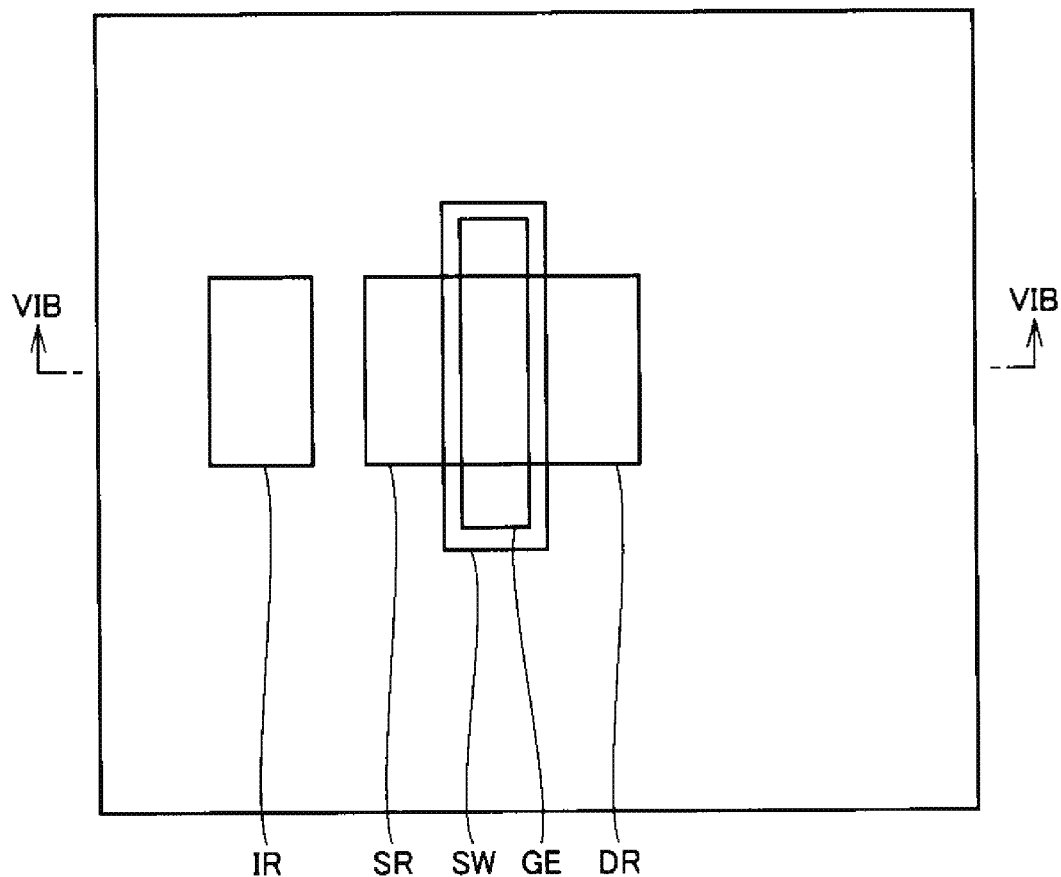
FIG. 6A and FIG. 6B are a plan view and a cross-sectional view showing a first step of the method of manufacturing a semiconductor device in Embodiment 1.
Figure 6B:
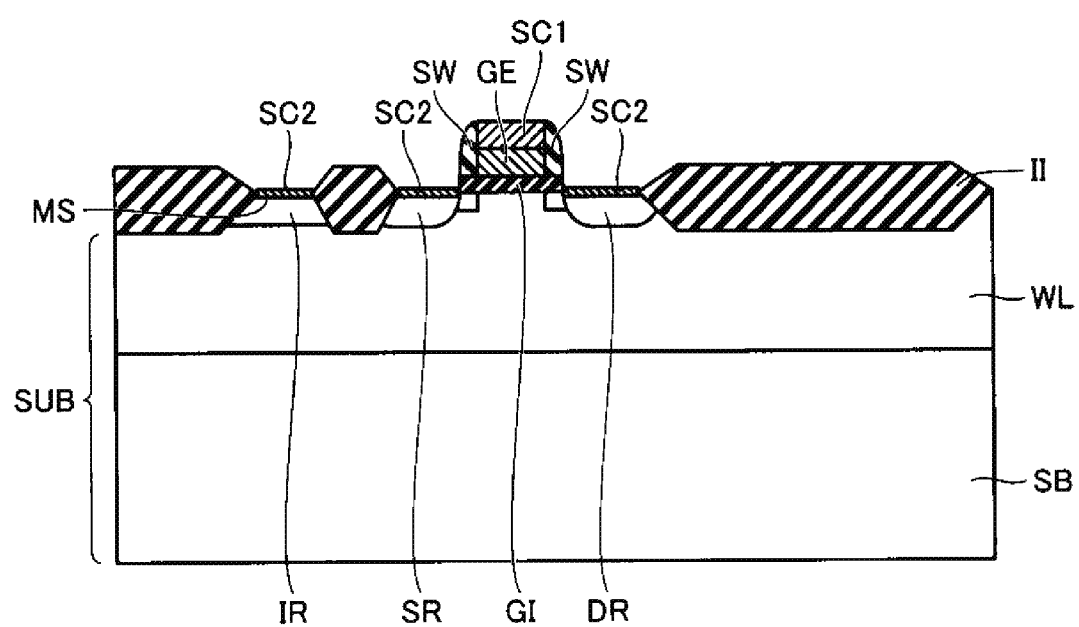

As shown in FIGS. 6A and B, silicon oxide (not shown) and silicon nitride films (not shown) are grown on the main surface MS of the semiconductor substrate SUB having the substrate region SB. Thereafter, a photoresist is coated on the silicon nitride film and patterned by exposure and development. Using the patterned photoresist as a mask, the silicon oxide film and the silicon nitride film are dry-etched. Thus, only the part of the silicon oxide film and the silicon nitride film where the LOCOS is formed is removed. The photoresist is then removed.

With the silicon nitride film and the silicon oxide film remaining, a thermal oxidation process for forming a LOCOS oxide film is performed. As a result, the isolation insulating film II made of LOCOS, for example, is formed on the main surface MS of the semiconductor substrate SUB. Thereafter, the silicon nitride film is removed.

Thereafter, p-type impurities are implanted into the semiconductor substrate SUB. As a result, p-well regions WL are formed on the main surfaces MS of the semiconductor substrates SUB. This step also serves to adjust the channel density of the nMOS transistor. When devices other than the nMOS transistor are mounted together, p-type impurities are selectively implanted into the semiconductor substrate SUB by coating, exposing, and developing a photoresist.

The silicon oxide film on the active region is removed by wet etching. As a result, the main surface MS of the active region of the semiconductor substrate SUB is exposed. Thereafter, a gate insulating film GI is formed on the exposed main surface MS of the semiconductor substrate SUB. The gate insulating film GI is, for example, silicon oxide and is formed by thermal oxidation.

A polycrystalline silicon GE is formed on the entire surface of the semiconductor substrate SUB. The polycrystalline silicon GE is subjected to phosphorus diffusion. As a result, a doped polysilicon GE doped with phosphorus is formed. A silicide layer SC1 made of tungsten silicide, for example, is formed on the doped polysilicon layer GE.

Thereafter, a photoresist is coated on the SC1 of the silicide layer, and the photoresist is patterned by exposure and development. The silicide layers SC1 and the doped polysilicon GEs are dry-etched using the patterned photoresists as masks. As a result, the silicide layer SC1 and the doped polysilicon GE are patterned to form a gate-electrode layer GE made of doped polysilicon. The silicide layer SC1 remains only directly above the gate electrode layer GE. The photoresist is then removed.

Using the gate electrode layer GE as a mask, phosphorus, for example, is implanted as an n-type impurity into the main surface MS of the semiconductor substrate SUB. This n-type impurity is implanted with implantation energy which is not implanted directly under the element isolation insulating film II. As a result, low concentration regions of the n-type source region SR and the n-type drain region DR having the LDD structure are formed. A low concentration region is also formed in a region where the p-type impurity region IR is formed.

Thereafter, a photoresist is coated on the entire surface of the semiconductor substrate SUB, and is patterned by exposure and development processing. Using the patterned photoresist as a mask, boron fluoride (BF2) is implanted into a region where a low-concentration region of the p-type impurity region (IR) is formed. As a result, a p-region is formed in the region where the p-type impurity region IR is formed. The photoresist is then removed.

A silicon oxide film is formed on the entire surface of the semiconductor substrate SUB so as to cover the upper surface of the silicide layer SC1. Thereafter, the entire surface of the silicon oxide film is dry-etched until the upper surface of the silicide layer SC1 is exposed. As a result, the silicon oxide film remains on the sidewalls of the gate electrode layer GE and the silicide layer SC1, and the sidewall insulating film SW made of silicon oxide is formed. By the dry etching, the main surface MS of the semiconductor substrate SUB other than the portion where the gate electrode layer GE, the sidewall insulating film SW, and the element isolation insulating film II are formed is exposed.

A silicon oxide film is formed so as to cover the exposed main surface MS of the semiconductor substrate SUB. Thereafter, a photoresist is coated on the entire surface of the semiconductor substrate SUB, and is patterned by exposure and development processing. Arsenic (As) is implanted into a region where the n-type source region SR and the n-type drain region DR are formed using the patterned photoresist or the like as a mask. As a result, a high concentration region of each of the n-type source region SR and the n-type drain region DR having the LDD structure is formed. As a result, an n-type source region SR and an n-type drain region DR having the LDD structure having the low concentration region and the high concentration region are formed. In addition, a nMOS transistor TR having an n-type source region SR, an n-type drain region DR, a gate insulating film GI, and a gate electrode layer GE is formed. The photoresist is then removed.

Thereafter, a photoresist is coated on the entire surface of the semiconductor substrate SUB, and is patterned by exposure and development processing. Using the patterned photo resist as a mask, boron (B) is implanted into a region of the p-type impurity region IR where the p-region is formed. Thus, a p-type impurity region IR is formed. The photoresist is then removed.

Thereafter, the silicon oxide film on the n-type source region SR, the n-type drain region DR, and the p-type impurity region IR is removed while leaving the sidewall insulating film SW and the element isolation insulating film II.

Thereafter, titanium (Ti) is formed by sputtering, and heat treatment is performed. By this heat treatment, titanium reacts with silicon on the main surface MS of the semiconductor substrate SUB. As a result, silicide layers SC2 are formed on n-type source regions SR, n-type drain regions DR, and p-type impurity regions IR.

Figure 7A:
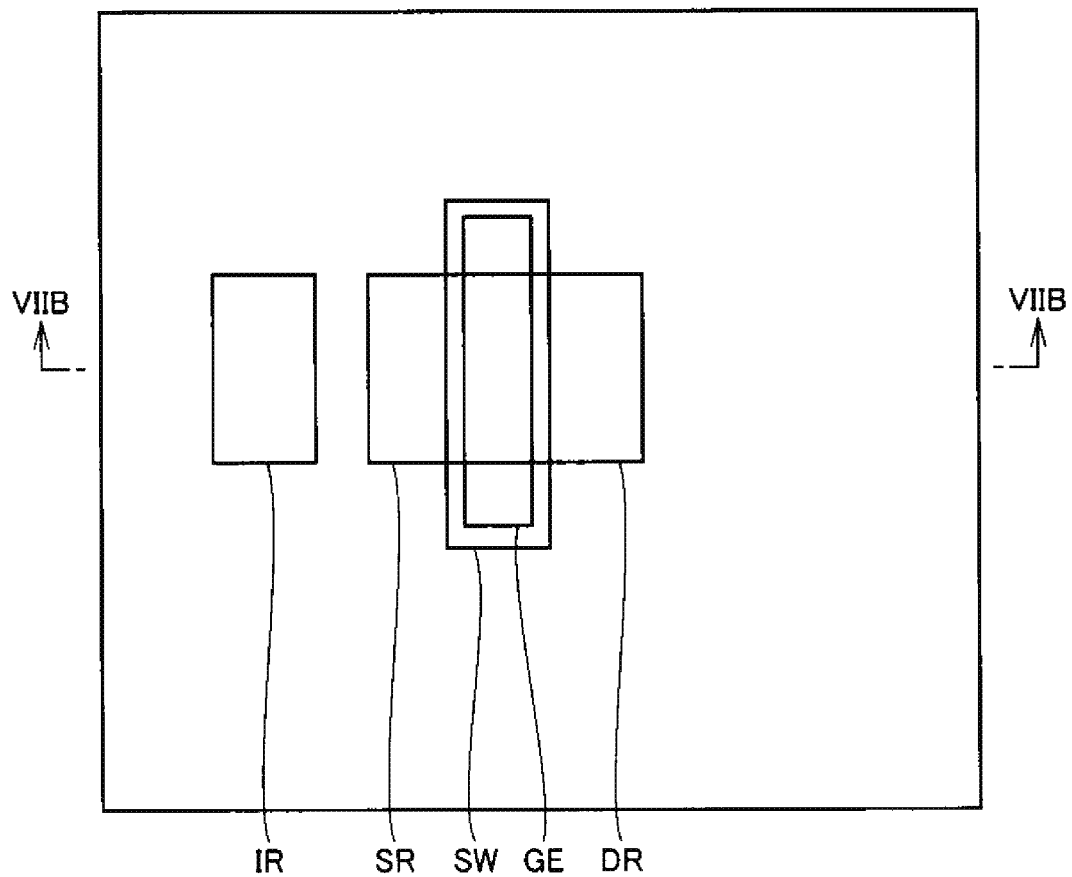
FIG. 7A and FIG. 7B are a plan view and a cross-sectional view showing a second step of the method of manufacturing a semiconductor device in Embodiment 1.

As shown in FIGS. 7(A) and (B), an inter-layer insulating film IL1, e.g., consisting of silicon oxide, is formed at a thickness of 150 nm. On the interlayer insulating film IL1, polysilicon PS is formed to a thickness of, for example, 250 nm. The polycrystalline silicon PS later becomes the resistive layer RL. Boron is implanted into the polycrystalline silicon PS. The implantation condition of boron is, for example, an implantation energy of 10 KeV and a dose of $5.0 \times 10^{15}$ cm$^{-2}$.

Figure 8A:
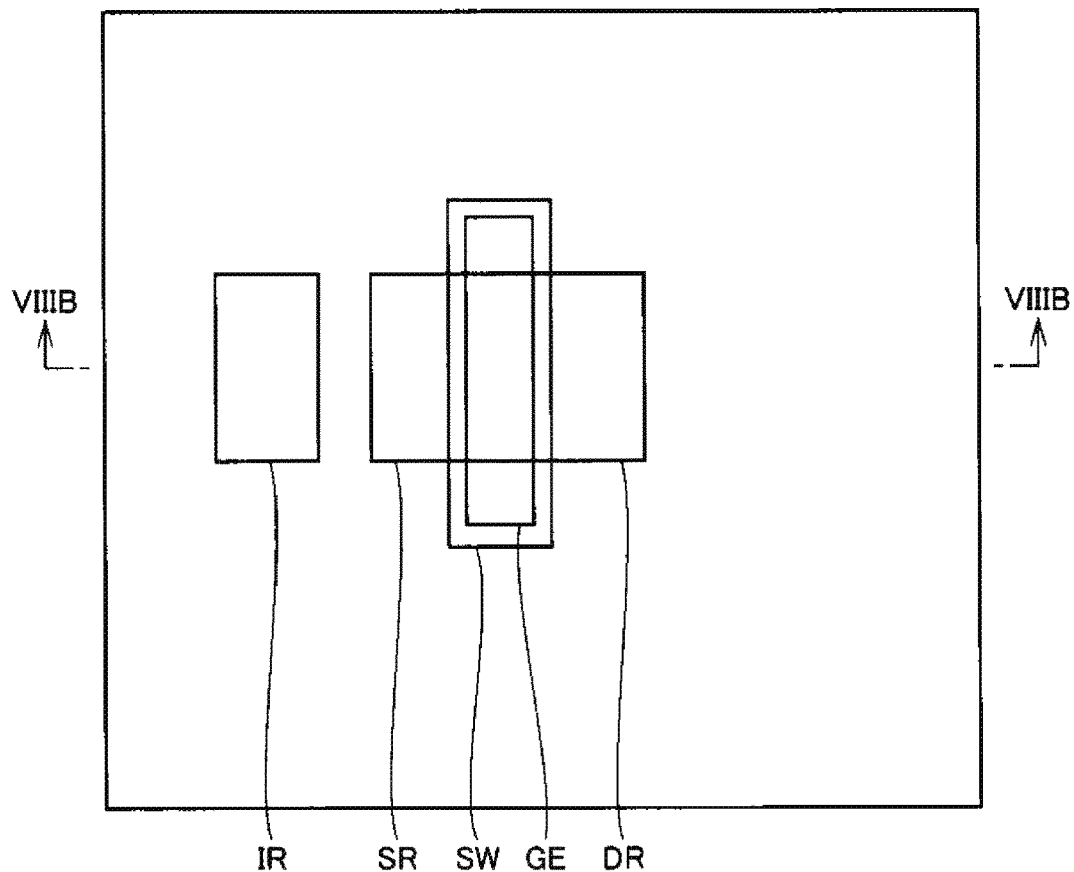
FIG. 8A and FIG. 8B are a plan view and a cross-sectional view showing a third step of the method of manufacturing a semiconductor device in Embodiment 1.
Figure 8B:
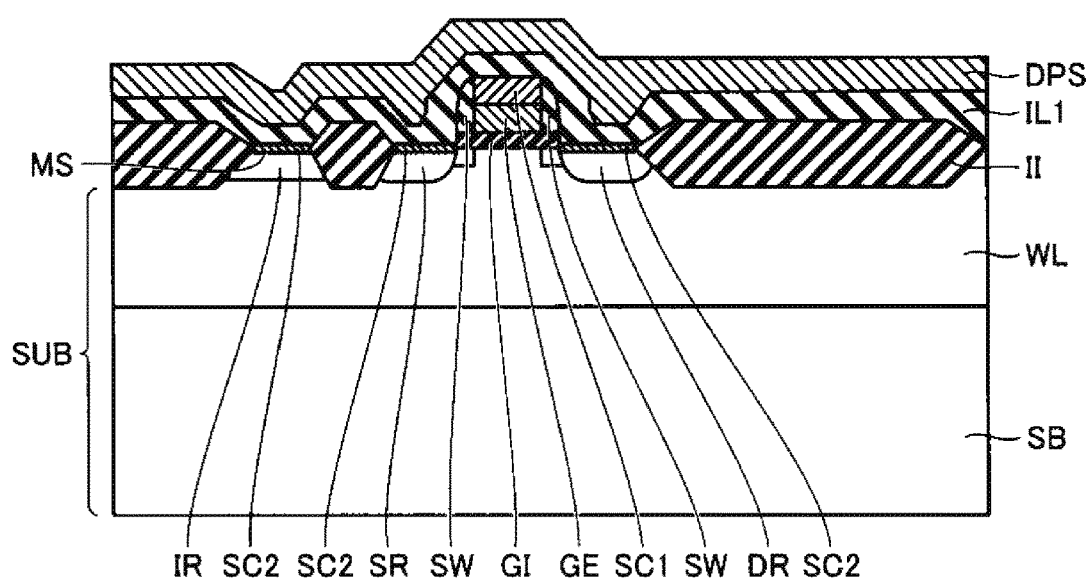

As shown in FIGS. 8(A) and (B), the boron doping causes the polycrystalline silicon PS to be boron injected into a doped polysilicon DPS.

Figure 12:
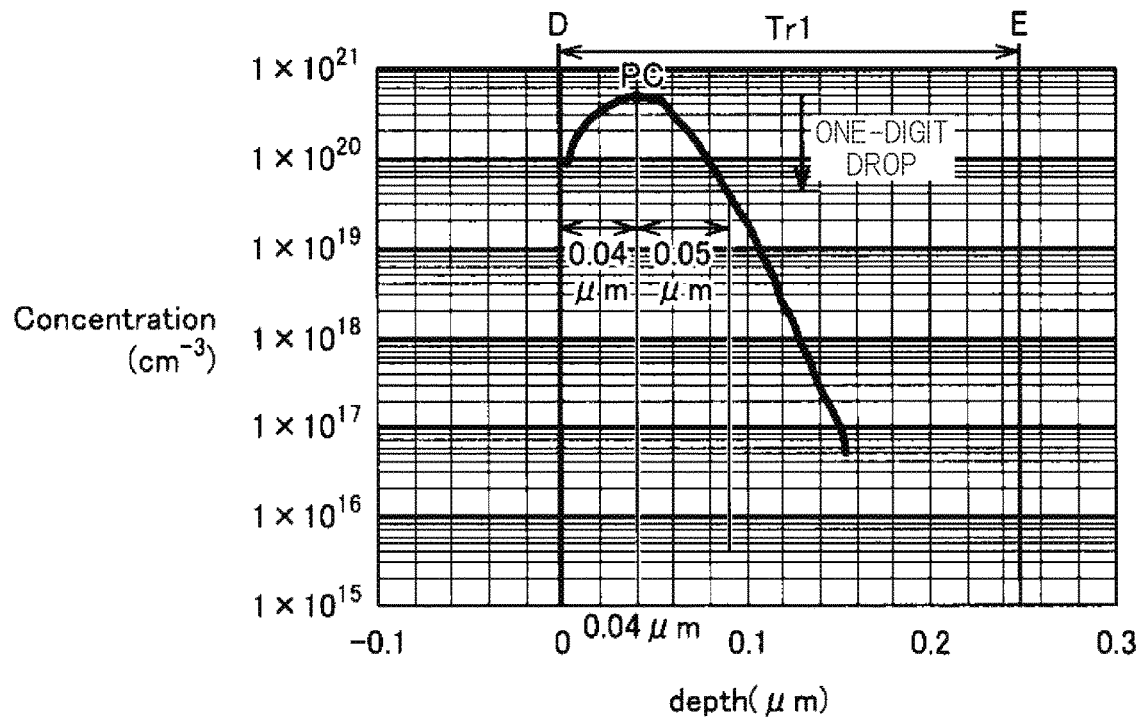
FIG. 12 is a diagram showing a concentration distribution of boron in a thickness direction immediately after boron is implanted into polycrystalline silicon serving as a resistive layer in the step shown in FIG. 8.

The boron concentration distribution in the thickness direction in the doped polysilicon DPS immediately after the boron implantation is in the state shown in FIG. 12, for example. As shown in FIG. 12, immediately after the boron implantation, the concentration peak PC of boron is located at a depth of, for example, about 0.04 μm from the upper surface D of the doped polysilicon DPS. The portion of the concentration peak PC having a boron concentration lower than the boron concentration by one order of magnitude is located at a depth of, for example, about 0.09 μm from the upper surface D of the doped polysilicon DPS.

Thereafter, a photoresist is coated on the doped polysilicon DPS and patterned by exposure and development. Using the patterned photoresist as a mask, dry etching is performed on the doped polysilicon DPS.

The photoresist is then removed.

Figure 9A:
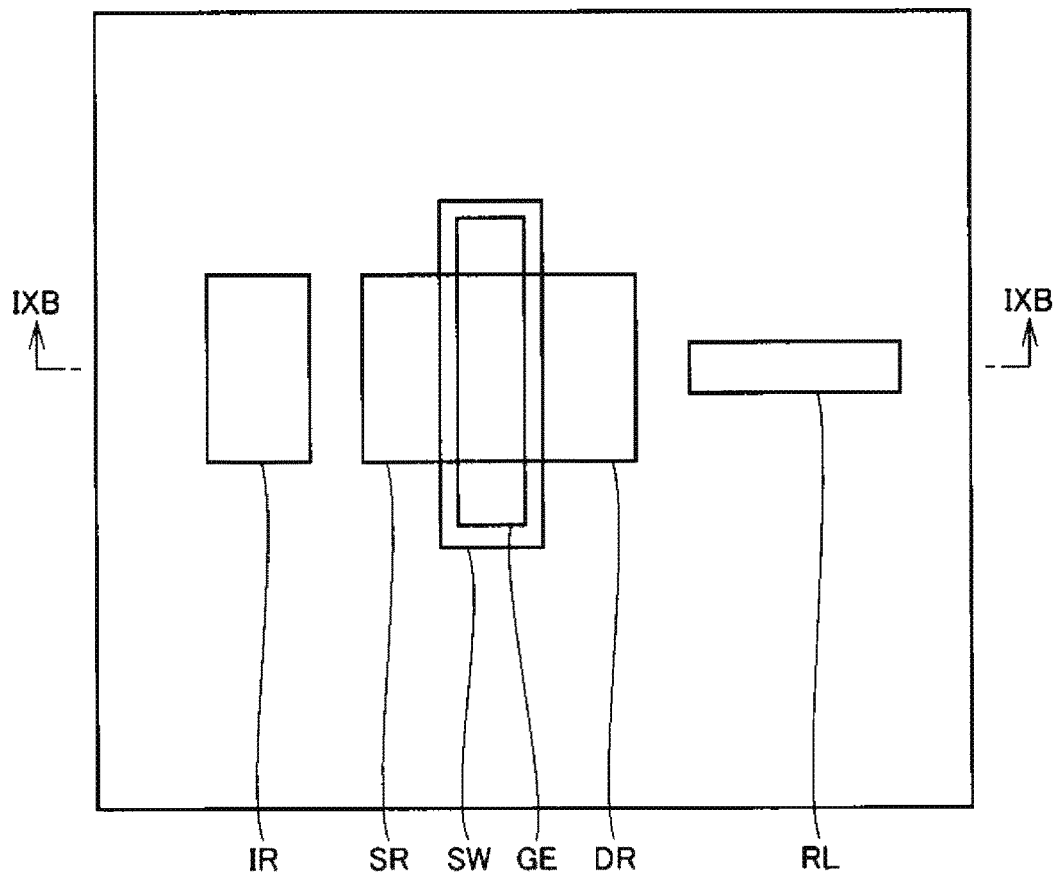
FIG. 9A and FIG. 9B are a plan view and a cross-sectional view showing a fourth step of the method for manufacturing a semiconductor device in Embodiment 1.
Figure 9B:
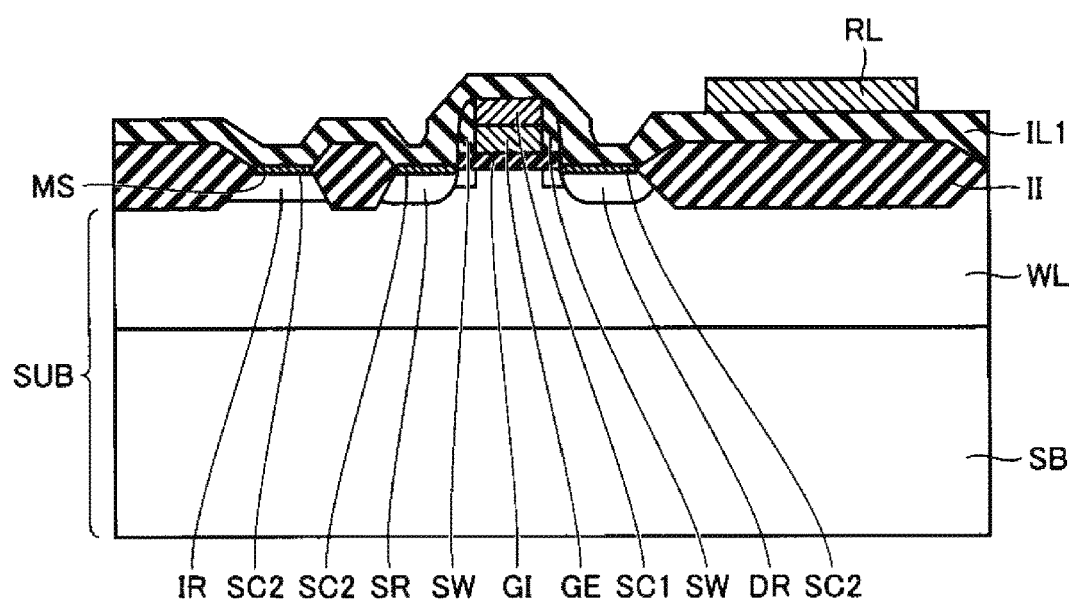

As shown in FIGS. 9A and 9B, the doped polysilicon DPS is patterned into a resistive layer RL by the above dry etching. An interlayer insulating film IL1 is formed to protect the nMOS transistor portion and the like at the time of the dry-etching. The resistive layer RL has a concentration distribution of boron shown in FIG. 12.

Figure 10A:
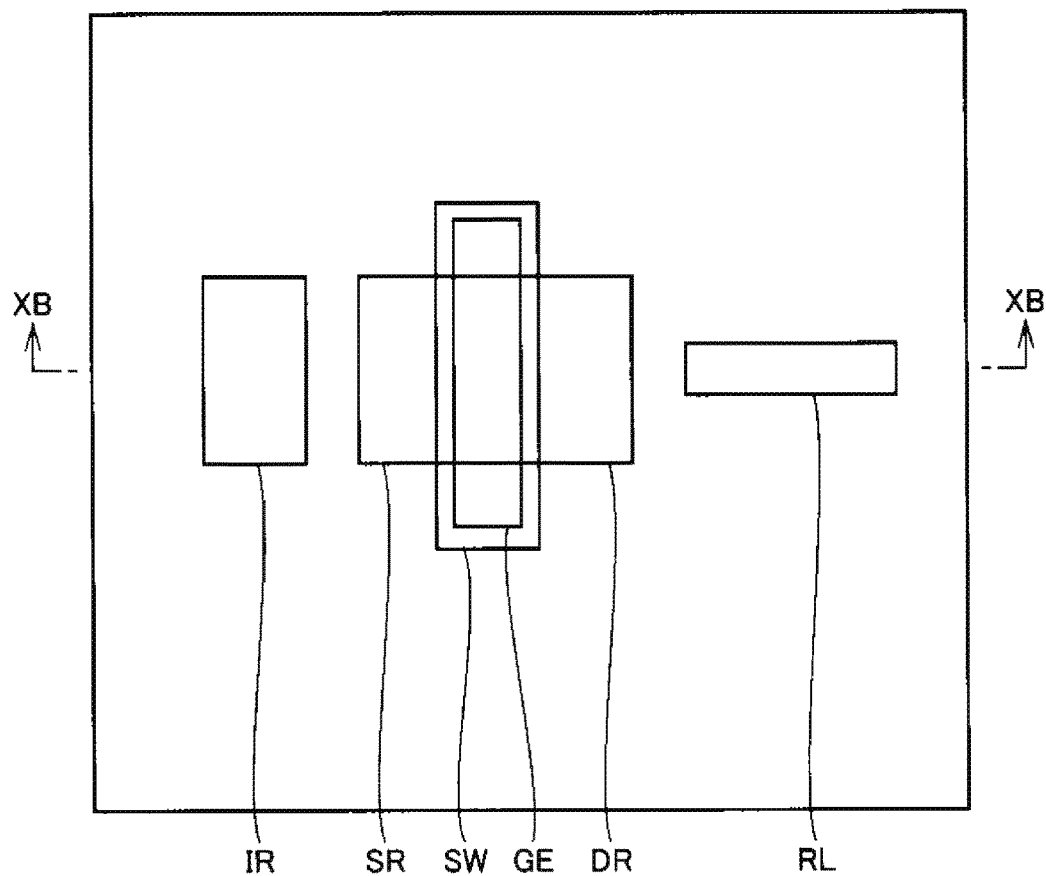
FIG. 10A and FIG. 10B are a plan view and a cross-sectional view showing a fifth step of the method for manufacturing a semiconductor device in Embodiment 1.
Figure 10B:
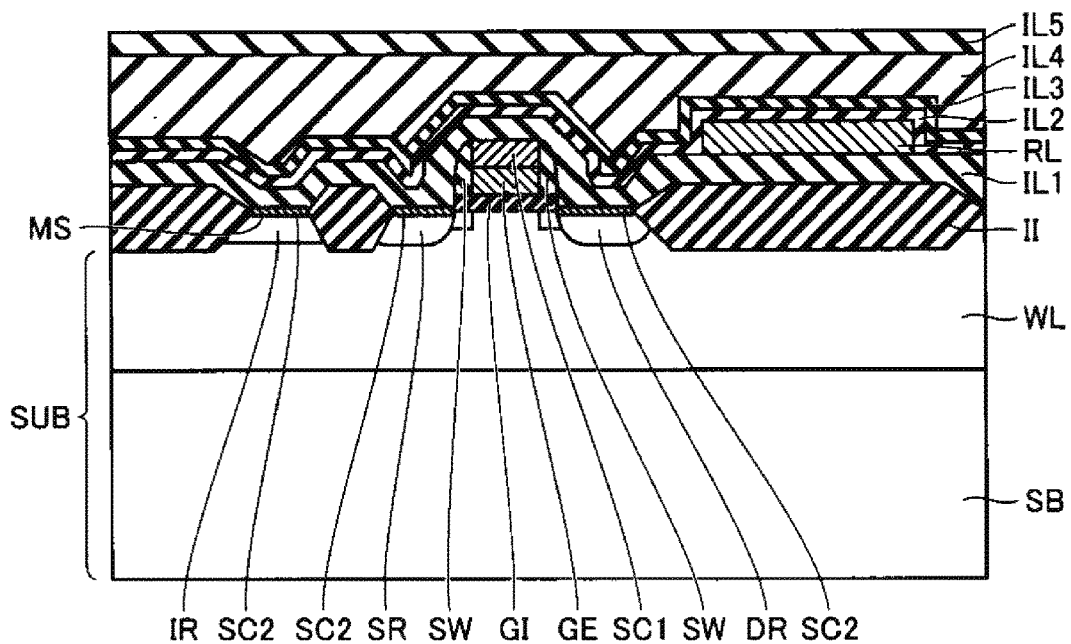

As shown in FIGS. 10A and 10B, an interlayer insulating film IL2 is formed to a thickness of, for example, 100 nm. The interlayer insulating film IL2 is, for example, silicon oxide. An interlayer insulating film IL3 is formed on the interlayer insulating film IL2 to a thickness of, for example, 25 nm. The interlayer insulating film IL3 is, for example, silicon nitride.

An interlayer insulating film IL4 is formed on the interlayer insulating film IL3 to a thickness of 1000 nm, for example. The interlayer insulating film IL2 is, for example, silicon oxide. Thereafter, annealing is performed, for example, at a temperature of 810° C. for a time of 30 seconds. This annealing activates boron in the resistive layer RL.

The concentration distribution of boron in the thickness direction in the resistive layer RL after this annealing is in the state shown in FIG. 5. Specifically, the concentration distribution of boron in the thickness direction in the resistive layer RL includes a concentration peak PC and a low concentration part LC having a concentration of boron that is two orders of magnitude or more lower than the concentration of boron in the concentration peak PC. The concentration of boron in the concentration peaks PC ranges, for example, from $1 \times 10^{19}$ to $1 \times 10^{21}$ cm$^{-3}$.

The concentration peak PC is located within, for example, ⅓ of the thickness Tr1 of the resistive layer RL from the upper surface D to the lower surface E of the resistive layer RL. The partial LC1 having a concentration of boron that is two orders of magnitude lower than the concentration of boron in the concentration peaks PC is located within, for example, ⅘ of the thickness Tr1 of the resistive layer RL from the upper surface D to the lower surface E of the resistive layer RL.

Thereafter, the interlayer insulating film IL4 is polished to a thickness of, for example, 500 nm by a Chemical Mechanical Polishing process to planarize the upper surface of the interlayer insulating film IL4.

On the interlayer insulating film IL4, an interlayer insulating film IL5 is formed to a thickness of 150 nm by, e.g., plasma-enhanced CVD (Chemical Vapor Deposition) method. The interlayer insulating film IL5 is, for example, silicon oxide.

Thereafter, a photo resist is coated on the interlayer insulating film IL5, and the photo resist is patterned by exposure and development. Using the patterned photo resist as a mask, dry etching is performed on the interlayer insulating film IL1~IL5. The photoresist is then removed.

Figure 11A:
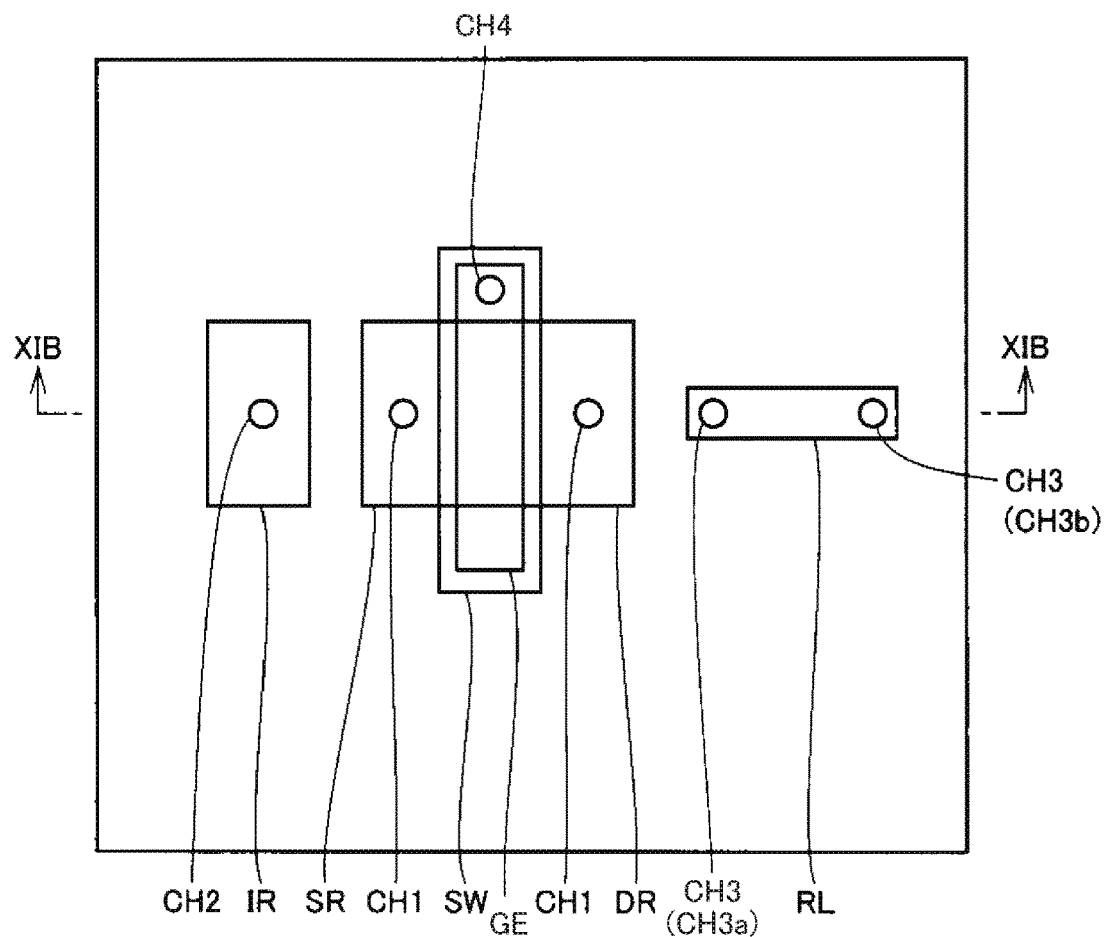
FIG. 11A and FIG. 11B are a plan view and a cross-sectional view showing a sixth step of the method for manufacturing a semiconductor device in Embodiment 1.

As shown in FIGS. 11(A) and (B), the dry etching described above simultaneously forms a contact hole CH1~CH3.

The contact hole CH1 is formed from the upper surface of the interlayer insulating film IL5 to reach the silicide layer SC2 located on each of the n-type source region SR and the n-type drain region DR. The contact hole CH2 is formed from the upper surface of the interlayer insulating film IL5 to reach the silicide layer SC2 located above the p-type impurity regions IR.

The contact hole CH3 is formed so as to reach the resistive layer RL from the upper surface of the interlayer insulating film IL5. The contact hole CH3 is formed to have a first contact hole CH3a and a second contact hole CH3b. The first contact hole CH3a is formed to reach the first end portion of the resistive layer RL, and the second contact hole CH3b is formed to reach the second end portion of the resistive layer RL.

As shown in FIG. 3, for example, a barrier metal, tungsten, and a barrier metal are sequentially formed on the interlayer insulating film IL5 so as to fill the contact hole CH1~CH3. Thereafter, the barrier metal, tungsten, and barrier metal are removed by CMP until the upper surface of the interlayer insulating film IL5 is exposed. As a result, each of the contact holes CH1~CH3 is filled with the barrier metal and tungsten, whereby the contact plug conductive layers PL1 are formed in the contact holes CH1~CH3.

In particular, the contact plug conductive layer PL1a disposed in the first contact hole CH3a is formed to be connected to the first end of the resistive layer RL. The contact plug conductive layer PL1b disposed in the second contact hole CH3b is formed to be connected to the second end of the resistive layer RL.

On the interlayer insulating film IL5, for example, a barrier metal, aluminum, and a barrier metal are formed in this order. Thereafter, the barrier metal, aluminum, and barrier metal are patterned by conventional photolithography and etching techniques. The patterned barrier metal, aluminum, and barrier metal form an interconnection-layer INT1.

An interlayer insulating film IL6 is formed on the interlayer insulating film IL5 so as to cover the interconnection layer INT1. The interlayer insulating film IL6 is, for example, a silicon oxide film. Thereafter, the upper surface of the interlayer insulating film IL6 is planarized by the CMP-process. An interlayer insulating film IL7 is formed on the interlayer insulating film IL6. The interlayer insulating film IL7 is, for example, silicon oxide.

Thereafter, via holes VH1 are formed in the interlayer insulating films IL6 and IL7 by ordinary photolithography and etch techniques. The via hole VH1 is formed so as to reach the interconnection layer INT1 from the upper surface of the interlayer insulating film IL7.

The via plug conductive layers PL2 are formed in the via holes VH1.

The via plug conductive layer PL2 is formed in the same manner as the contact plug conductive layer PL1, for example. An interconnection layer INT2 is formed on the interlayer insulating film IL7. The wiring layer INT2 is formed in the same manner as the wiring layer INT1, for example.

An interlayer insulating film IL8 is formed on the interlayer insulating film IL7 so as to cover the interconnection layer INT2. The interlayer insulating film IL8 is, for example, a silicon oxide film. Thereafter, the upper surface of the interlayer insulating film IL8 is planarized by the CMP-process. An interlayer insulating film IL9 is formed on the interlayer insulating film IL8. The interlayer insulating film IL9 is, for example, silicon oxide.

Thereafter, via holes VH2 are formed in the interlayer insulating films IL8 and IL9 by ordinary photolithography and etch technologies. The via hole VH2 is formed so as to reach the interconnection layer INT2 from the upper surface of the interlayer insulating film IL9.

The via plug conductive layers PL3 are formed in the via holes VH2. The via plug conductive layer PL3 is formed in the same manner as the contact plug conductive layer PL1, for example. An interconnection layer INT3 is formed on the interlayer insulating film IL9. The wiring layer INT3 is formed in the same manner as the wiring layer INT1, for example.

A cover insulating film IL10 is formed on the interlayer insulating film IL9 so as to cover the interconnection layer INT3. The covering insulating film IL10 is, for example, a silicon oxide film. A cover insulating film IL11 is formed on the cover insulating film IL10. The covering insulating film IL11 is, for example, a silicon nitride film. Thereafter, openings OP are formed in the insulating covers IL10 and IL11 by conventional photolithography and etch techniques. The opening OP is formed so as to extend from the upper surface of the insulating film IL11 to the interconnection layers INT3.

A passivation film PSV is formed on the cover insulating film IL11. The passivation film PSV is, for example, polyimide. For example, the same portion as the opening OP of the passivation film PSV is opened by development processing.

As described above, the semiconductor device of the present embodiment is manufactured. Next, the effect of the present embodiment will be explained in comparison with the comparative example.

Figure 7B:
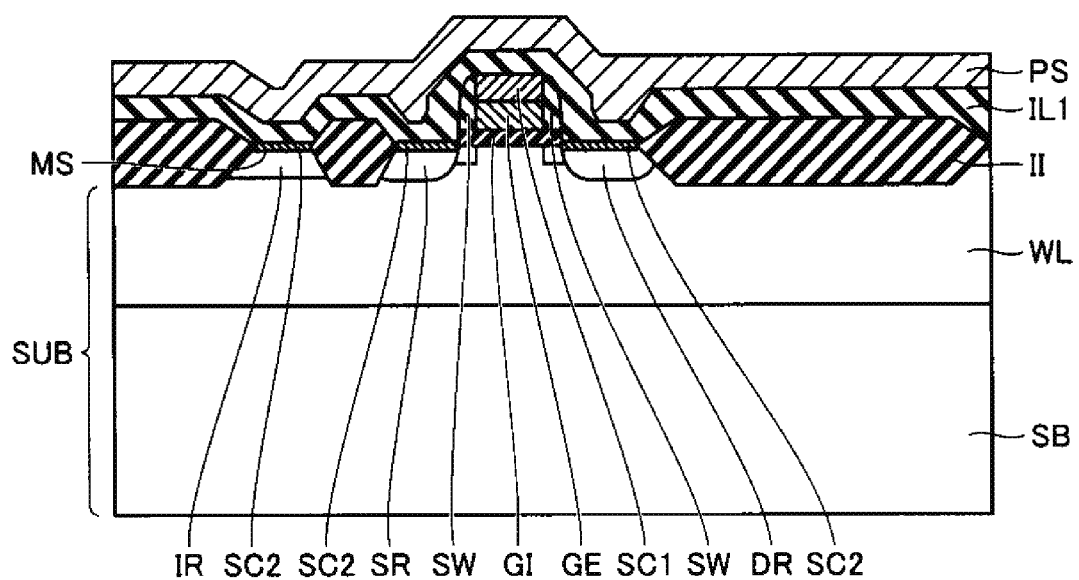

First, as a comparative example, the case where boron is implanted into the polysilicon PS in the steps shown in FIGS. 7A and 7B under the conditions of implantation energies of 30 KeV and dose amounts of $2.5 \times 10^{15}$ cm$^{-2}$ will be described.

Figure 13:
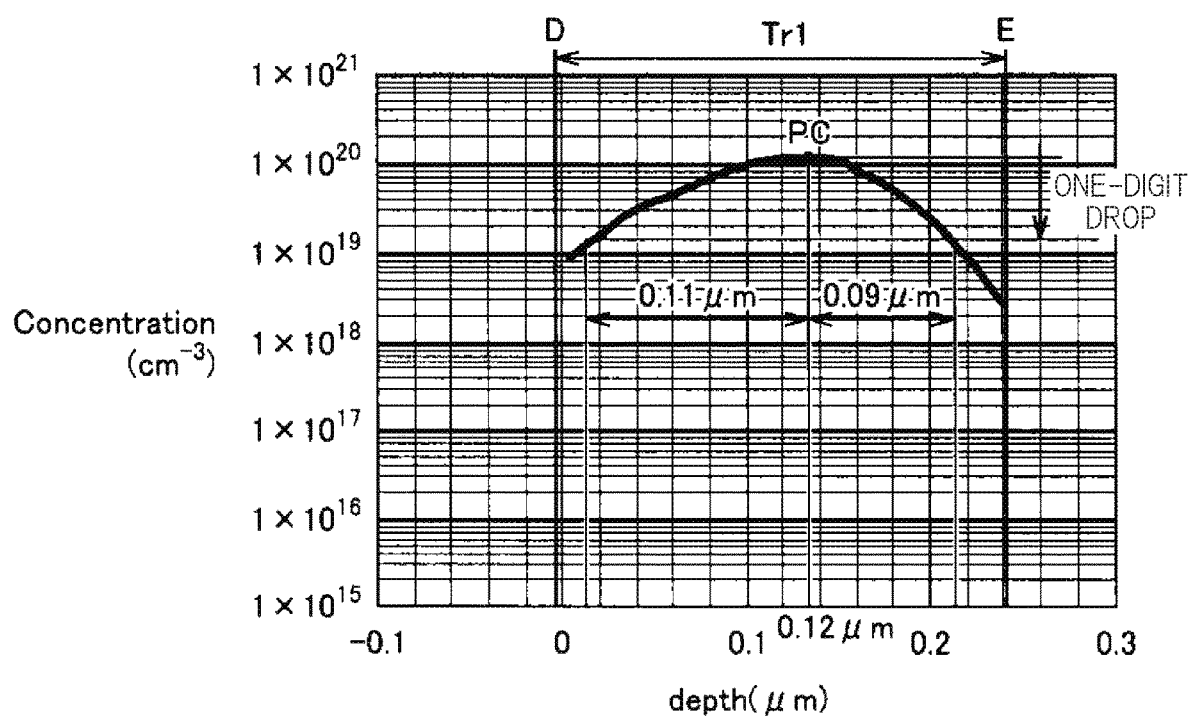
FIG. 13 is a diagram showing a concentration distribution of boron in a thickness direction immediately after boron is implanted into polycrystalline silicon serving as a resistive layer in the comparative example.
Figure 14:
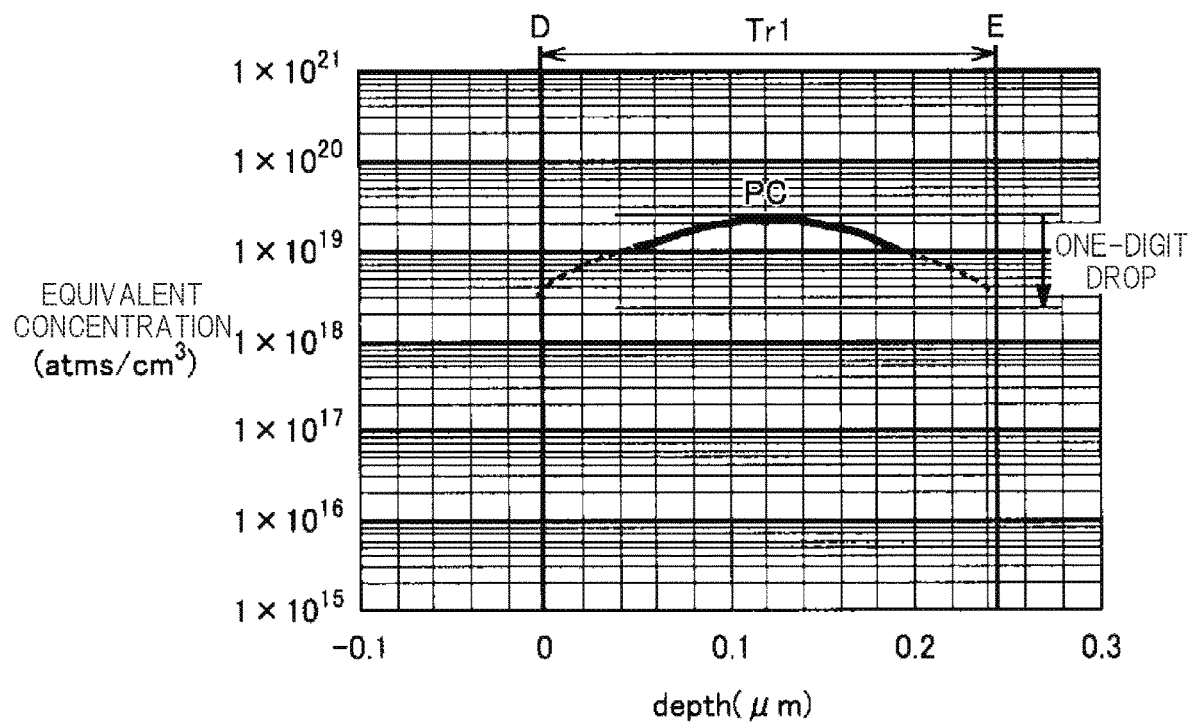
FIG. 14 is a diagram showing the concentration distribution of boron in the thickness direction in the resistive layer after the semiconductor device is completed in the comparative example.

When boron is implanted into the polycrystalline silicon PS under the above conditions, the concentration distribution of boron in the polycrystalline silicon PS immediately after the boron implantation is in the state shown in FIG. 13. From the state shown in FIG. 13, the concentration distribution of boron in the resistance layer RL after annealing in the steps shown in FIGS. 10A and 10B becomes the state shown in FIG. 14.

As is apparent from FIG. 13, in the above-described injection conditions, there is no portion having a boron concentration which is two orders of magnitude or more lower than the boron concentration in the concentration peak PC immediately after the boron injection. The concentration peak PC is located substantially at the center of the thickness of the resistive layer RL. As is clear from FIG. 14, after the annealing, the concentration distribution of boron becomes smoother than that in FIG. 13. Specifically, there is no portion having a concentration of boron lower than the concentration of boron in the concentration peak PC by one order of magnitude or more.

Next, the inventors examined the relationship between the sheet resistance (ρs) and the temperature coefficient when the dose is changed by setting the implantation energy at 10 KeV and 30 KeV at the time of boron implantation into polycrystalline silicon. The results are shown in FIG. 15.

Figure 15:
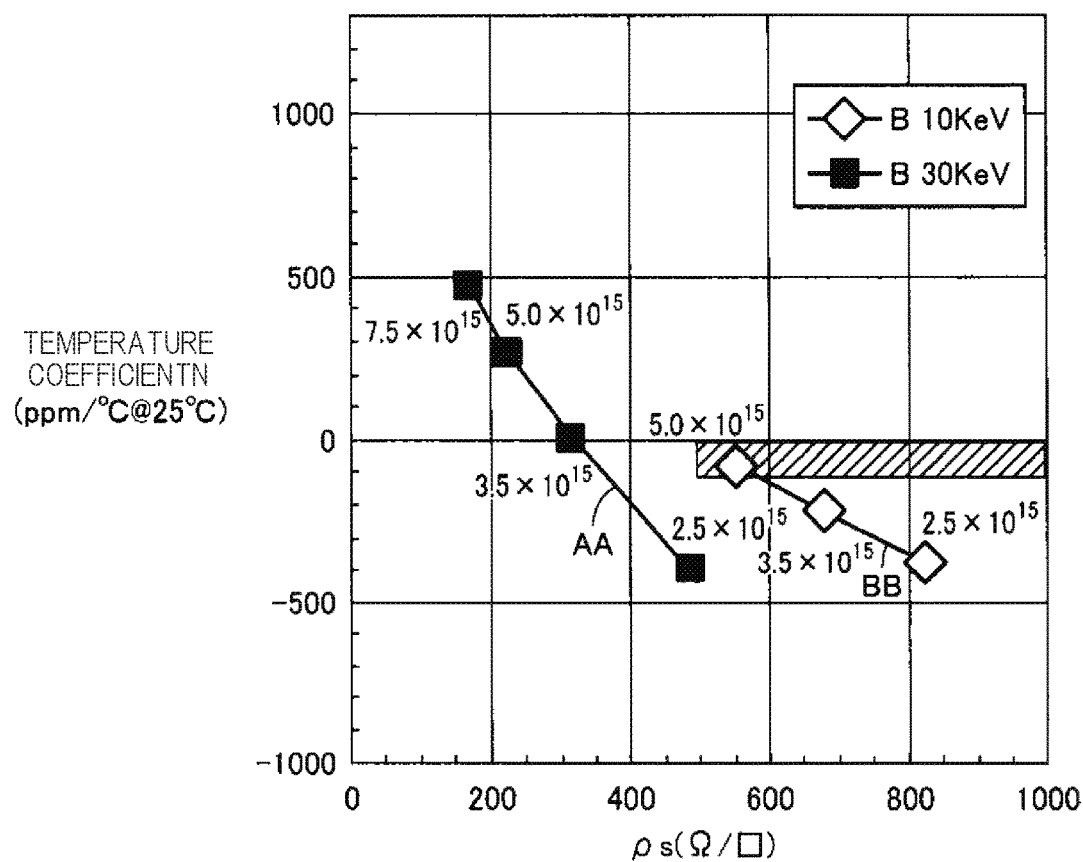
FIG. 15 is a graph showing the relationship between the sheet resistance and the temperature coefficient of the resistive layer when the injection energy of boron into the resistive layer is 10 KeV and 30 KeV.

The sheet resistance value in FIG. 15 is calculated as follows. First, a plurality of TEGs (Test Element Group) corresponding to the resistance layers RL are formed by varying the line widths W of the resistance layers RL and the distances L between the first and second contact plug conductive layers PL1a and PL1b. Ion implantation is performed on each of the plurality of TEGs under the same conditions. For each of these TEGs, the resistance R of the resistance layer RL including the contact resistance Rc between each of the first and second contact plug conductive layers PL1a and PL1b and the resistance layer RL is expressed by the following equation (1). In the following equation (1), ΔW represents the amount of variation of W due to machining.

$$R = \{L/(W-2\Delta W)\} \times \rho s + 2Rc \qquad (1)$$

The sheet resistance value is calculated from the above equation (1) on the assumption that the sheet resistance value is the same for multiple TEGs.

As for the temperature coefficient in FIG. 15, the sheet resistance value was calculated as described above at the temperatures of −40° C., 0° C., 25° C., 75° C., and 150° C., and the first-order coefficient (b) when the calculated sheet resistance value (y) was represented by the quadratic function (y=ax2+bx+c) of the temperature (x) was used as the temperature coefficient.

From the results shown in FIG. 15, it can be seen that when the implantation energy is 30 keV as in the comparative example, the temperature coefficient approaches 0 by increasing the dose from 2.5×1015 cm−2, but at the same time, the sheet resistance value (ρs value) decreases. From this result, it is understood that a resistive element having a sheet resistance value (ρs value) of 500Ω/□ or more cannot be obtained with a temperature coefficient of −100 ppm/° C. or more and 0 ppm/° C. or less when the implantation energy is 30 KeV.

On the other hand, when the implantation energy is 10 KeV as in the present embodiment, it is understood that the dependence line of the temperature coefficient and the sheet resistance value (ρs value) is shifted to the high ρs side in comparison with the comparative example. For example, when looking at the points in the dose is 5.0×1015 cm−2, it can be seen that the sheet resistance value (ρs value) is 575Ω/□ at the temperature coefficient of 100 ppm/° C. and the sheet resistance value and the low temperature coefficient and the high sheet resistance, which were not obtained in the comparative example, can be obtained at the same time.

This is because the concentration distribution of boron as shown in FIG. 12 is obtained by setting the implantation energy to 10 KeV. That is, as shown in FIG. 12, the concentration peak PC of boron is located at about 40 nm from the surface of the polycrystalline silicon PS immediately after the implantation (within a range of ⅓ of the thickness from the upper surface of the polycrystalline silicon PS), and the distance from the concentration peak PC to the tail thereof (falling by one order of magnitude from the concentration peak PC) is 40 to 50 nm, which is narrower than in the comparative example.

As a result, even after boron is diffused in the polycrystalline silicon PS in the subsequent annealing treatment, the boron concentration distribution in the resistance layer RL has a concentration of boron that is two orders of magnitude or more lower than the concentration of boron in the concentration peak PC, as shown in FIG. 5. That is, the upper layer of the resistive layer RL is a region in which the concentration of boron is high, and the lower layer of the resistive layer RL is a region in which the concentration of boron is low. When a current flows through the resistive layer RL, a current preferentially flows through the upper layer of the resistive layer RL, and almost no current flows through the lower layer. Therefore, the resistive layer RL can be considered to have two layers, namely, an upper layer and a lower layer in a pseudo manner.

Since the upper layer of the resistive layer RL has a higher concentration of boron than the lower layer, the upper layer has a low temperature coefficient and a low sheet resistance value. The lower layer of the resistive layer RL has a higher temperature coefficient and a higher sheet resistance because the concentration of boron is lower than that of the upper layer. Since the resistance layer RL has such a characteristic that the two resistors of the upper layer and the lower layer are connected in parallel, as a result, a resistance layer RL having a low temperature coefficient and a high sheet resistance value can be obtained.

More specifically, when a current flows in the resistance layer RL as described above, a current preferentially flows in the upper layer of the resistive layer RL, and almost no current flows in the lower layer. Since the upper layer through which the current flows has a higher boron concentration than the lower layer, it is considered that a low temperature coefficient can be obtained. The cross-sectional area of the upper layer through which the current flows is smaller than the entire cross-sectional area of the resistive layer RL. Therefore, in the present embodiment, it is considered that the sheet resistance value (ρs value) was increased in comparison with the comparative example.

As described above, in the present embodiment, as shown in FIG. 5, the resistive layer RL has a high concentration region in the vicinity of the concentration peak PC and a low concentration region having a concentration of boron that is two orders of magnitude or more lower than the concentration of boron in the concentration peak PC. Therefore, a low temperature coefficient and a high sheet resistance value can be obtained.

In the present embodiment, as shown in FIG. 5, the concentration peak PC of the resistive layer RL is located within a range of ⅓ of the thickness of the resistive layer RL from the upper surface D. This makes it possible to clearly separate the high concentration region and the low concentration region in the resistive layer RL.

In the present embodiment, as shown in FIG. 5, the partial LC1 having a concentration of boron that is two orders of magnitude lower than the concentration of boron in the concentration peaks PC is located within ⅘ of the thickness of the resistive layers RL from the upper surface D of the resistive layers RL. This makes it possible to clearly divide the resistance layer RL into an upper layer of a high concentration region and a lower layer of a low concentration region.

Figure 11B:
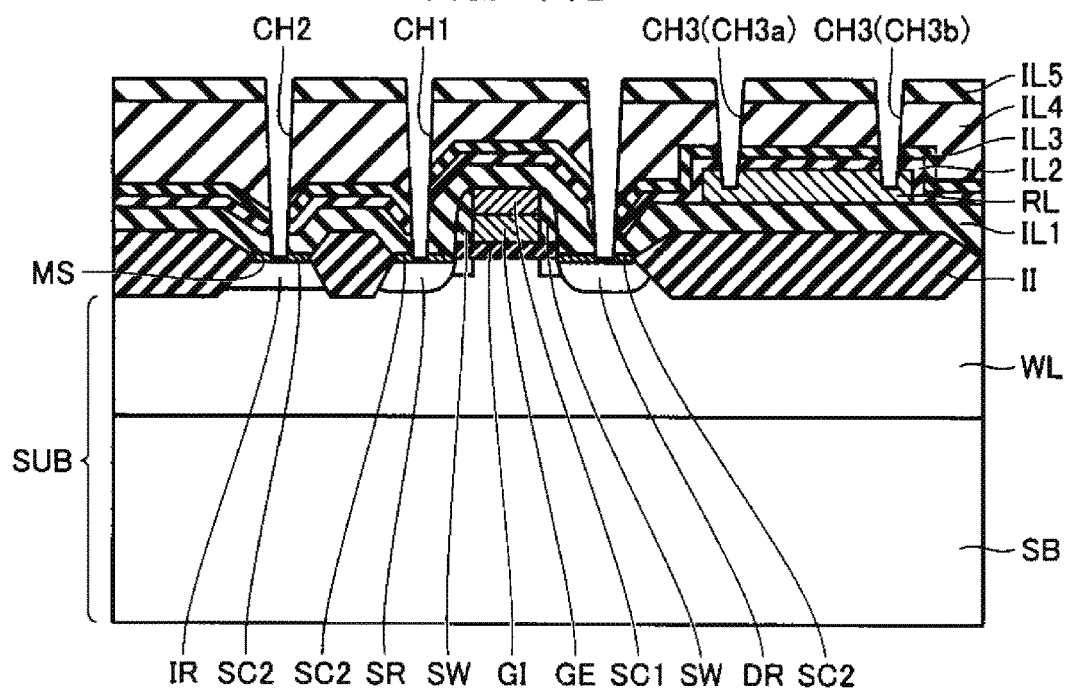
Figure 16:
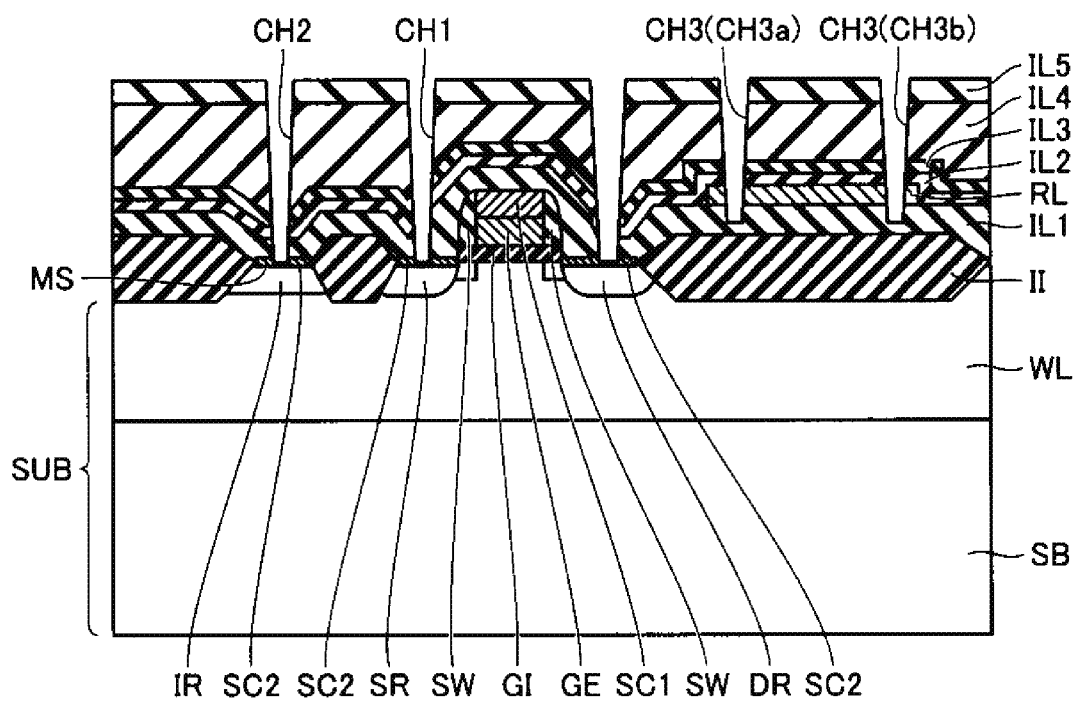
FIG. 16 is a cross-sectional view for explaining that the contact hole penetrates the resistive layer when the resistive layer is formed to be thin.

By simply reducing the thickness of the resistive layer RL, it is conceivable to increase the sheet resistance while making the temperature coefficient close to 0. However, when the contact holes CH1~CH3 are formed at the same time as shown in FIG. 11, the contact holes CH3 may penetrate the resistive layers RL as shown in FIG. 16. This is because since the contact hole CH3 is shallower than the contact holes CH1 and CH2, the over etching amount of the contact hole CH3 in the dry etching is larger than the over etching amounts of the contact holes CH1 and CH2.

When the contact hole CH3 penetrates the resistive layer RL, the contact area between the contact plug conductive layer PL1 and the resistive layer RL becomes only the sidewall of the thin resistive layer RL, resulting in an increase in contact resistance. Therefore, the thickness of the resistive layer RL cannot be easily changed.

In FIG. 15, in order to obtain a resistive layer RL having a temperature coefficient of −100 ppm/° C. or more and a sheet resistance value (ρs value) of 500Ω/□ or more, it is preferable that the temperature of the resistive layer RL has an implantation energy of 12 KeV or less and a dose of 4.5×1015 cm−2 or more, and as an example, the implantation energy is 10 KeV and the dose is 4.5×1015 cm−2 or more and 5.5×1015 cm−2 or less.

Second Embodiment

The configuration of the semiconductor device according to the present embodiment will be described with reference to FIGS. 17 and 18.

Figure 17:
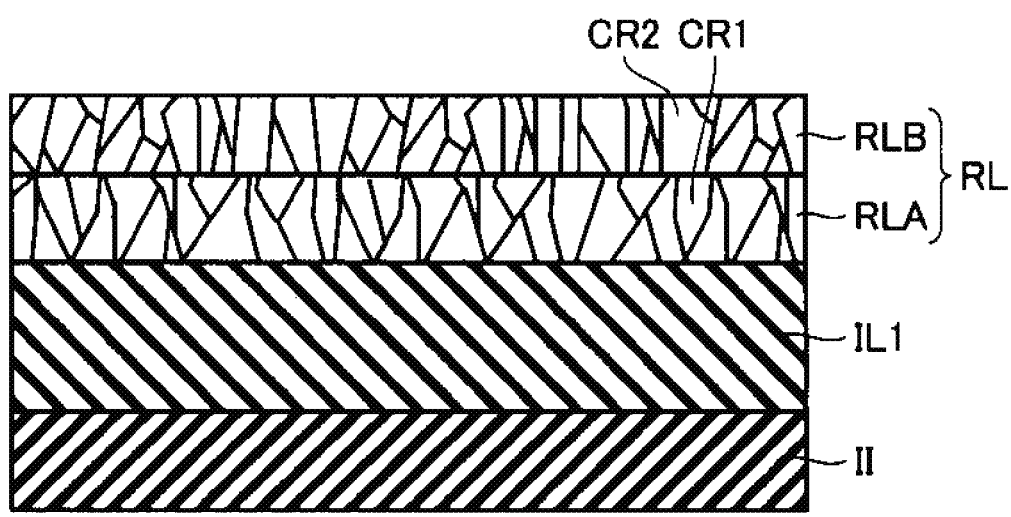
FIG. 17 is a cross-sectional view showing a crystal state of a resistive layer applied to the semiconductor device in Embodiment 2.

As shown in FIG. 17, the configuration of the semiconductor device of the present embodiment differs from that of the first embodiment in the configuration of the resistive layer RL. The resistive layer RL in the present embodiment has a first layer RLA and a second layer RLB. The first layer RLA is located on the lower surface of the resistive layer RL. The second layer RLB is located on the upper surface of the resistive layer RL and is in contact with the upper surface side of the first layer RLA.

The plurality of crystal grains CR1 in the first layer RLA and the plurality of crystal grains CR2 in the second layer RLB are separated from each other at the border between the first layer RLA and the second layer RLB. A silicon oxide film may exist between the crystal grains CR1 in the first layer RLA and the crystal grains CR2 in the second layer RLB. The silicon oxide film between the first layer RLA and the second layer RLB does not prevent electrical connection between the first layer RLA and the second layer RLB. The silicon oxide film may be located entirely or partially between the crystal grain CR1 in the first layer RLA and the crystal grain CR2 in the second layer RLB. When the silicon oxide film is located in a part between the first layer RLA and the second layer RLB, the crystal grains CR1 in the first layer RLA and the crystal grains CR2 in the second layer RLB may be in direct contact with each other.

Figure 18:
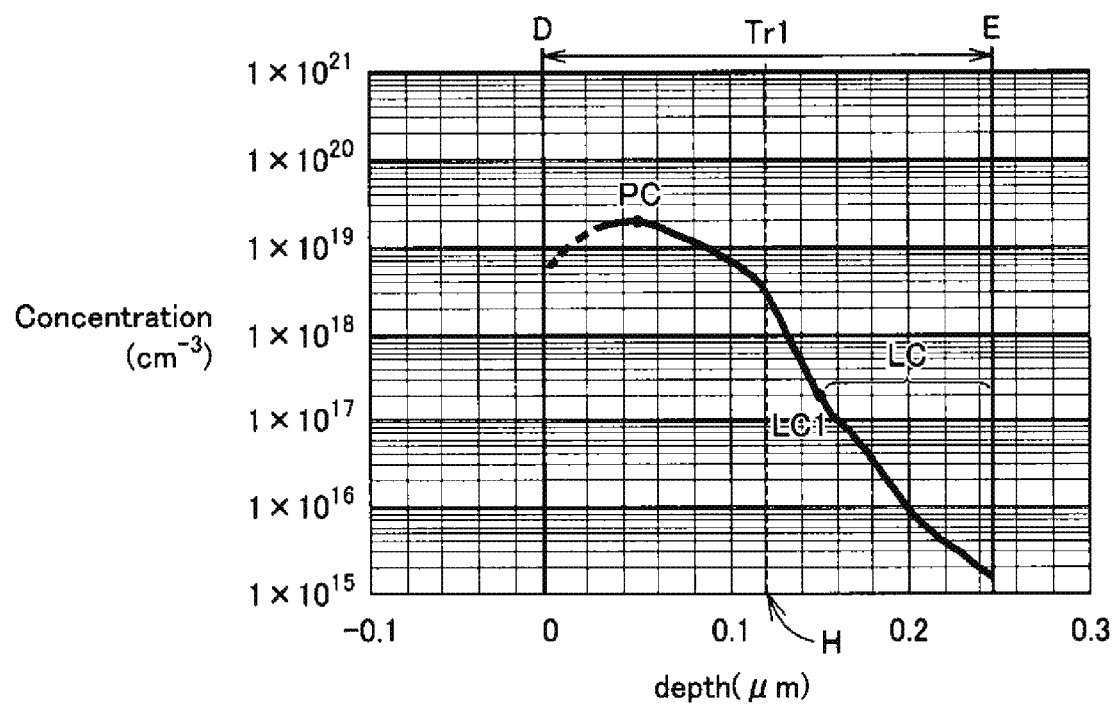
FIG. 18 is a diagram showing the concentration distribution of boron in the thickness direction in the resistive layer applied to the semiconductor device in Embodiment 2.

As shown in FIG. 18, the concentration distribution of boron in the thickness direction in the resistive layer RL in the present embodiment includes a concentration peak PC and a low concentration portion LC having a concentration of boron that is two orders of magnitude or more lower than the concentration of boron in the concentration peak PC. The concentration of boron in the concentration peaks PC ranges, for example, from 1×1019 to 1×1021 cm−3.

The concentration peak PC is located within, for example, ⅓ of the thickness Tr1 of the resistive layer RL from the upper surface D to the lower surface E of the resistive layer RL. The concentration peak PC is located in the second layer RLB. The partial LC1 having a concentration of boron that is two orders of magnitude lower than the concentration of boron in the concentration peaks PC is located within, for example, ⅘ of the thickness Tr1 of the resistive layer RL from the upper surface D to the lower surface E of the resistive layer RL.

The boron concentration gradient in the first layer RLA is steeper than the boron concentration gradient in the second layer RLB with the boundary H between the first layer RLA and the second layer RLB of the resistance layer RL as a boundary.

Since the configuration of the present embodiment other than the above is substantially the same as the configuration of the first embodiment, the same elements are denoted by the same reference numerals, and description thereof will not be repeated.

The resistive layer RL in this embodiment is formed by depositing a silicon oxide film of ~a few Å or less, for example, by a method called the O2 leakage method during the deposition of the polycrystalline silicon film shown in FIGS. 7(A) and (B). The O2 leakage method does not insulate the first layer RLA and the second layer RLB from each other. The grain CR1 of the first layer RLA and the grain CR2 of the second layer RLB are separated from each other by the silicon oxide film.

Boron is implanted into the polycrystalline silicon having the first layer RLA and the second layer RLB. In this boron injection, boron is injected so that the concentration peak PC of boron is located in the second layer RLB. More specifically, boron is implanted so that the concentration peak of boron is located at a position of, for example, 40 nm from the upper surface D of the polycrystalline silicon. The progress of the boron diffused in the annealing thereafter stops once at the boundary H between the first layer RLA and the second layer RLB. Therefore, as shown in FIG. 18, the gradient of the boron concentration in the first layer RLA becomes steeper than the gradient of the boron concentration in the second layer RLB with the boundary H as a boundary.

Since the manufacturing method of the present embodiment other than the above is substantially the same as the manufacturing method of the first embodiment, the description thereof will not be repeated.

In the present embodiment, the boron concentration gradient in the first layer RLA becomes steeper than the boron concentration gradient in the second layer RLB with the boundary H as a boundary. Therefore, a lower layer (first layer RLA) and an upper layer (second layer RLB) having different characteristics (temperature coefficient, sheet resistance) can be formed with the boundary H as a boundary. Therefore, it is possible to achieve both a temperature coefficient lower than that of the first embodiment and a sheet resistance higher than that of the first embodiment.

In addition, setting of the position of the border H is facilitated by the O2 leakage method. This facilitates setting of a high range and a low range of the boron concentration in the resistive layer RL, thereby facilitating control of the characteristics (temperature coefficient and sheet resistance).

For example, when the thermal coefficient is slightly higher and the sheet resistance is slightly lower than the characteristic when the boundary H due to the O2 leakage is located 120 nm from the upper surface of the resistance layer RL, the position of the boundary H may be slightly lower (for example, 150 nm from the upper surface of the resistance layer RL).

Third Embodiment

In embodiments 1 and 2, the case where the dopant to be injected into the polycrystalline silicon is boron has been described, but the dopant may be boron fluoride (BF2). In order to make the boron fluoride have the same concentration peak position as the boron, the injection energy of the boron fluoride is higher than the injection energy of the boron. Therefore, it is easier for boron fluoride to bring the concentration peak position closer to the upper surface of polycrystalline silicon than boron.

For example, the concentration peak positions of boron injection energy of 10 KeV and boron fluoride injection energy of 44.5 KeV are the same. Therefore, the injection energy of boron fluoride of 44.5 KeV is more stable in manufacturing.

Forth Embodiment

As shown in (A) and (B) of FIG. 21(4) in the present embodiment, in addition to the low temperature coefficient of the first embodiment and the first resistive layer RL1 of the high sheet resistance, a second resistive layer RL2 of the high sheet resistance, which does not require a particularly low temperature coefficient, may be formed at the same time as the first resistive layer RL1 in the present embodiment. Hereinafter, a process of forming the first resistive layer RL1 and the second resistive layer RL2 will be described as the present embodiment.

In the manufacturing method of the present embodiment, first, the steps shown in FIGS. 6(A), (B) to 7(A) and (B) are performed. Thereafter, boron is implanted into the polysilicon PS under the condition that the implantation energy is 30 keV and the dose is $8.0 \times 10^{14}$ cm$^{-2}$, for example.

Figure 19A:
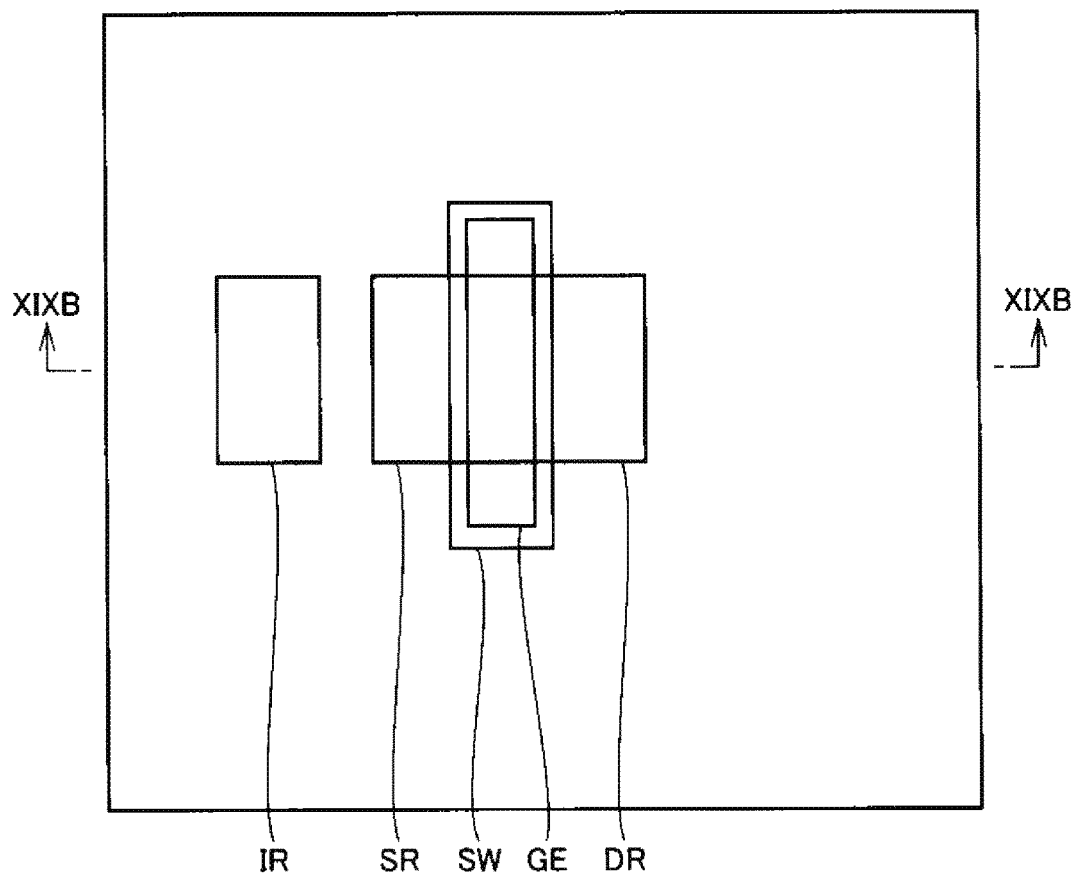
FIG. 19A and FIG. 19B are a plan view and a cross-sectional view showing a first step of the method of manufacturing a semiconductor device in Embodiment 4.
Figure 19B:
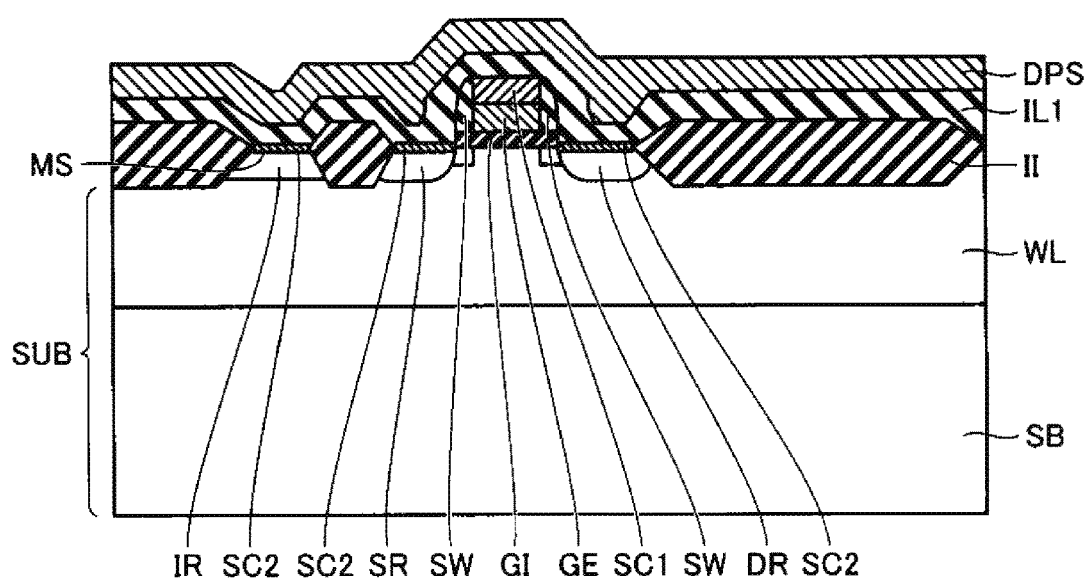

As shown in FIGS. 19(A), (B), polycrystalline silicon PS is a boron-doped polysilicon DPS by boron infusion.

Figure 20A:
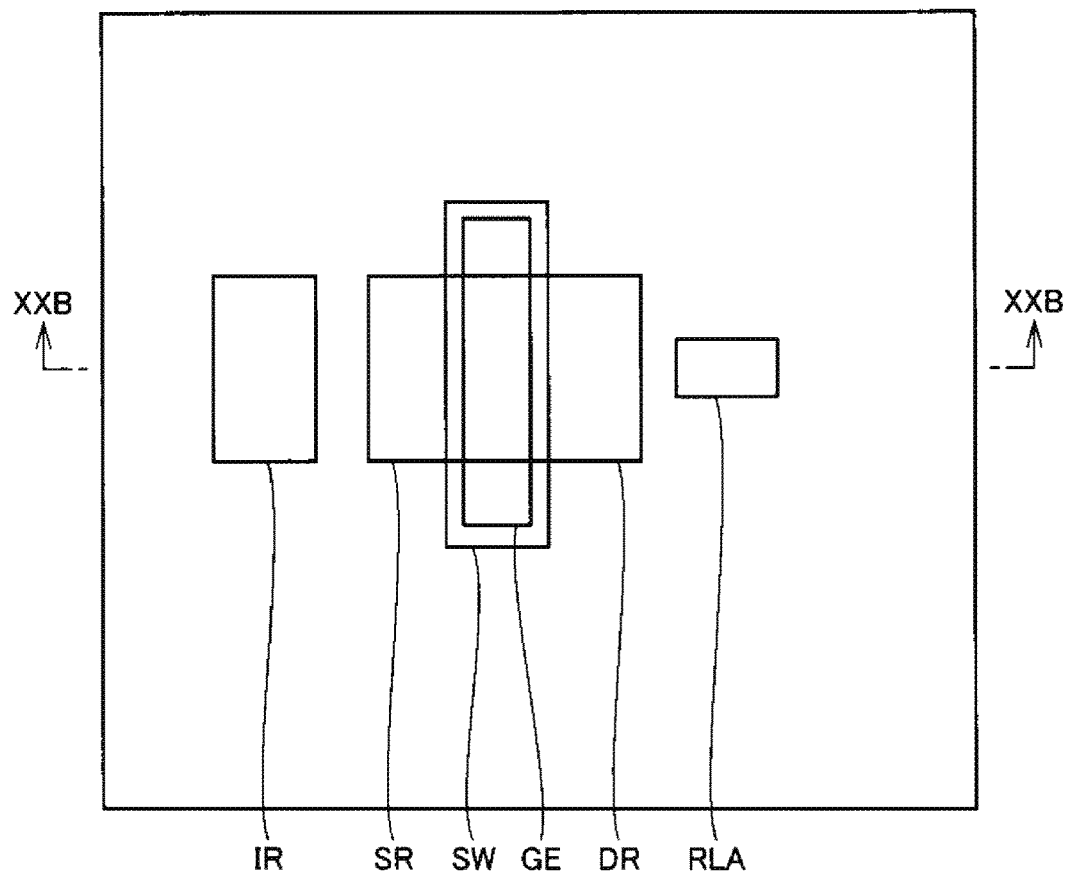
FIG. 20A and FIG. 20B are a plan view and a cross-sectional view showing a second step of the method of manufacturing a semiconductor device in Embodiment 4.
Figure 20B:
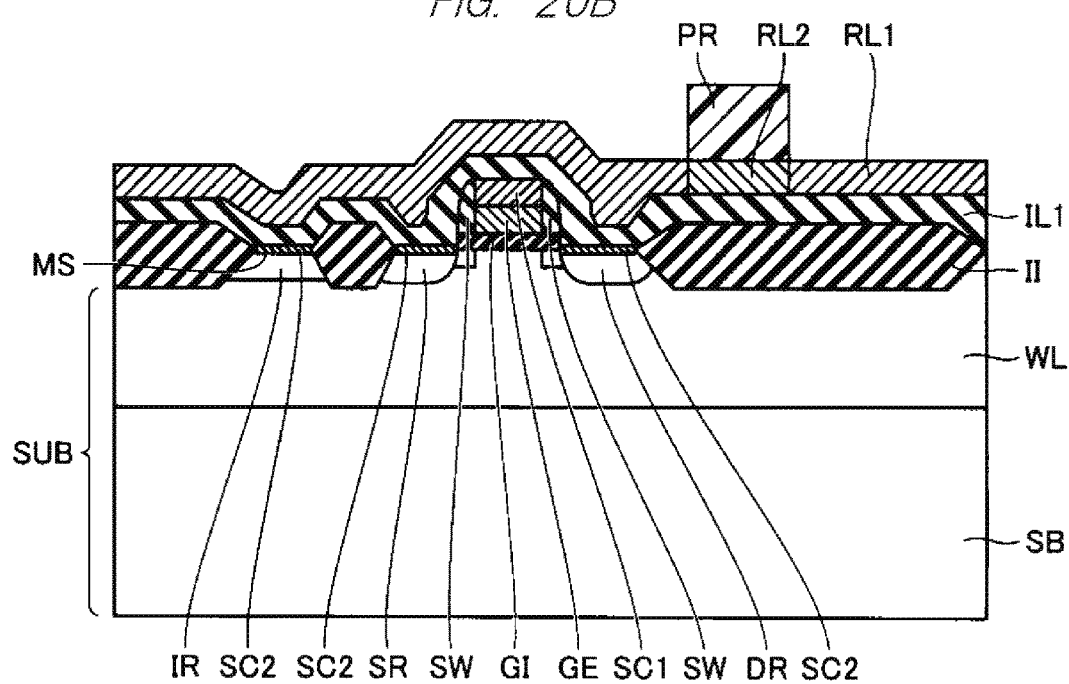

As shown in FIGS. 20A and 20B, a photoresist PR is coated on the doped polysilicon DPS and patterned by exposure and development processing. Using the patterned photoresist PR as a mask, boron is selectively implanted into the doped polysilicon DPS at an implantation energy of 10 KeV and a dose of $5.0 \times 10^{15}$ cm$^{-2}$, for example. As a result, the first region RL1 into which boron is implanted twice and the second region RL2 into which boron is implanted only once are formed in the doped polysilicon DPS. Thereafter, the photoresist PR is removed.

The doped polysilicon DPS is then patterned by conventional photolithography and etching techniques.

Figure 21A:
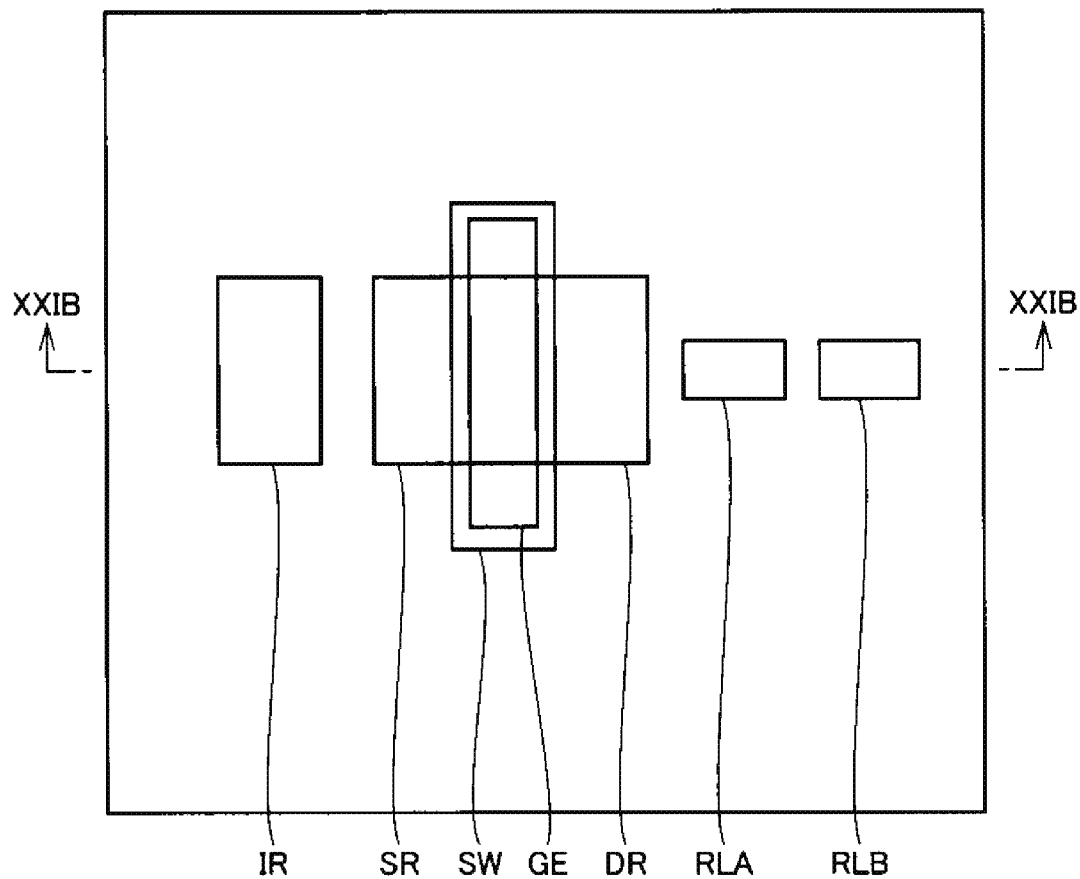
FIG. 21A and FIG. 21B are a plan view and a cross-sectional view showing a third step of the method of manufacturing a semiconductor device in Embodiment 4.
Figure 21B:
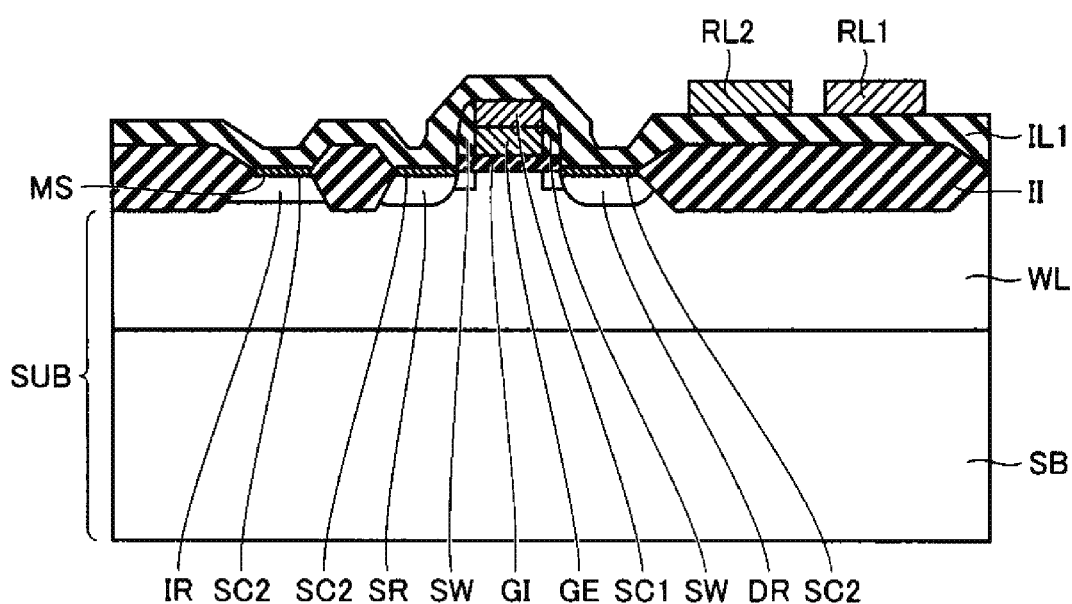

As shown in FIGS. 21A and 21B, the first resistive layer RL1 formed of the first region RL1 and the second resistive layer RL2 formed of the second region RL2 are formed separately from each other by the patterning.

Subsequently, the semiconductor device according to the present embodiment is manufactured by following the same steps as in the first embodiment shown in FIGS. 10(A), (B), and 11(A), and (B).

According to the present embodiment, although the second resistive layer RL2 has a high-temperature coefficient, the second resistive layer RL1 has a sheet resistance (ρs is about 2 kΩ/□) higher than that of the first resistive layer RL1. In the first resistive layer RL1, boron is injected under the condition of 30 KeV and $8.0 \times 10^{14}$ cm$^{-2}$, the concentration gradient becomes slower than the concentration distribution shown in FIG. 5, but the characteristics of high sheet resistance (ρs is, for example, 400 ppm/° C., 130Ω/□) can be obtained at low temperature coefficients.

Note that each of the first resistive layer RL1 and the second resistive layer RL2 in the present embodiment may have a structure in which crystal grains are divided between an upper layer and a lower layer as described in Embodiment 2.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
   a first conductive layer; a second conductive layer; and a resistive layer having a first end and a second end connected to the first conductive layer at the first end, the resistive layer being connected to the second conductive layer at the second end,
   wherein the resistive layer is comprised of polycrystalline silicon comprising p-type impurities without comprising n-type impurities, and
   wherein a concentration distribution of the p-type impurities in a thickness direction of the resistive layer comprises:
     a concentration peak; and
     a low concentration portion having a concentration of the p-type impurities less than a concentration of the p-type impurities at the concentration peak by two orders of magnitude,
   wherein the concentration peak and the low concentration portion are located at a central portion of the resistive layer, the central portion being between the first end and the second end.

2. The semiconductor device according to claim 1,
   wherein the resistive layer has:
     a lower surface; and
     an upper surface facing the lower surface in the thickness direction, and
   wherein the concentration peak is located within a range of ⅓ of a thickness of the resistive layer from the upper surface.

3. The semiconductor device according to claim 2,
   wherein a portion in which the concentration of the p-type impurities is less than the concentration of the p-type impurities of the concentration peak by two orders of magnitude, is located within a range of ⅘ of the thickness of the resistive layer from the upper surface.

4. The semiconductor device according to claim 1,
   wherein the resistive layer has:
     a lower surface; and
     an upper surface facing the lower surface in the thickness direction, and
   wherein the resistive layer has:
     a first layer; and
     a second layer in contact with a surface of the first layer in an upper surface side, and
   wherein a plurality of crystal grains in the first layer and a plurality of crystal grains in the second layer are separated with each other at a boundary between the first layer and the second layer.

5. The semiconductor device of claim 4,
   wherein the concentration peak is located in the second layer.

6. The semiconductor device according to claim 1,
   wherein the p-type impurities contain boron.

7. A method of manufacturing a semiconductor device, comprising:
   forming a resistive layer comprised of polycrystalline silicon, the resistive layer having a first end and a second end; and
   forming a first conductive layer connected to the resistive layer at the first end, and forming a second conductive layer connected to the resistive layer at the second end,
   wherein the forming the resistive layer comprises:
     forming the resistive layer comprising p-type impurities without comprising n-type impurities;
     forming a film composed of the resistive layer:
     introducing the p-type impurities into the resistive layer; and
     annealing the resistive layer to activate the p-type impurities introduced into the resistive layer,
   wherein a concentration distribution of p-type impurities in a thickness direction of the resistive layer comprises:
     a concentration peak; and
     a low concentration portion having a concentration of the p-type impurities less than a concentration of p-type impurities at the concentration peak by two orders of magnitude, and wherein the concentration peak and the low concentration portion are located at a central portion of the resistive layer, the central portion being between the first end and the second end.

8. The method of manufacturing a semiconductor device according to claim 7,
wherein the resistive layer has:
a lower surface; and
an upper surface facing the lower surface in the thickness direction, and
wherein the introducing the p-type impurities into the resistive layer is performed so that the concentration peak is located within a range of ⅓ of a thickness of the resistive layer from the upper surface.

9. The method of manufacturing a semiconductor device according to claim 8,
wherein the introducing the p-type impurities into the resistive layer and the annealing the resistive layer are performed so that a portion having a concentration of the p-type impurities which is less than the concentration of the p-type impurities in the concentration peak by two orders of magnitude is located within a range of ⅘ of the thickness of the resistive layer from the upper surface.

10. The method of manufacturing a semiconductor device according to claim 7,
wherein the p-type impurities contain boron.

11. The method of manufacturing a semiconductor device according to claim 7,
wherein the resistive layer has:
a lower surface; and
an upper surface opposed to the lower surface in the thickness direction, and
wherein the forming the resistive layer includes:
forming a first layer; and
forming a second layer being in contact with a surface of the first layer on an upper surface side, and
wherein the first layer and the second layer are formed so that a plurality of crystal grains in the first layer and the plurality of crystal grains in the second layer are separated from each other at a boundary between the first layer and the second layer.

12. The method of manufacturing a semiconductor device according to claim 11,
wherein the introducing the p-type impurities into the resistive layer is performed so that the concentration peak is located in the second layer.

13. The method of manufacturing a semiconductor device according to claim 12,
wherein the p-type impurities contain boron.

14. The method of manufacturing a semiconductor device according to claim 10,
wherein, in the introducing the p-type impurities into the resistive layer, the p-type impurities are introduced into the resistive layer by injecting boron fluoride into the resistive layer.

15. The method of manufacturing a semiconductor device according to claim 13,
wherein, in the introducing the p-type impurities into the resistive layer, the p-type impurities are introduced into the resistive layer by injecting boron fluoride into the resistive layer.

* * * * *